United States Patent
Pandey et al.

(10) Patent No.: US 12,414,223 B2
(45) Date of Patent: Sep. 9, 2025

(54) ENCLOSURE ASSEMBLIES, AND RELATED DEVICES AND METHODS

(71) Applicant: Cummins Inc., Columbus, IN (US)

(72) Inventors: Vineet K. Pandey, Columbus, IN (US); William B. Fields, Seymour, IN (US); Isreal I. Llaguno, Columbus, IN (US); Bharadwaj Ramakrishnan, Bargersville, IN (US); Bradford K. O. Palmer, Ham Lake, MN (US); Jaydeep V. Patel, Fishers, IN (US); Michael Hays, Columbus, IN (US); Dakshina S. Murthy-Bellur, Plymouth, MN (US); Amir Tajuddin Tamboli, Columbus, IN (US); Rohit Saha, Columbus, IN (US)

(73) Assignee: Cummins Inc., Columbus, IN (US)

( * ) Notice: Subject to any disclaimer, the term of this patent is extended or adjusted under 35 U.S.C. 154(b) by 291 days.

(21) Appl. No.: 18/265,049

(22) PCT Filed: Dec. 3, 2021

(86) PCT No.: PCT/US2021/061887
§ 371 (c)(1),
(2) Date: Jun. 2, 2023

(87) PCT Pub. No.: WO2022/120227
PCT Pub. Date: Jun. 9, 2022

(65) Prior Publication Data
US 2024/0107654 A1 Mar. 28, 2024

Related U.S. Application Data

(60) Provisional application No. 63/120,905, filed on Dec. 3, 2020.

(51) Int. Cl.
*H05K 1/02* (2006.01)
*H05K 1/14* (2006.01)
*H05K 1/18* (2006.01)

(52) U.S. Cl.
CPC ......... *H05K 1/0201* (2013.01); *H05K 1/0277* (2013.01); *H05K 1/144* (2013.01);
(Continued)

(58) Field of Classification Search
CPC .................................. H05K 1/0201
(Continued)

(56) References Cited

U.S. PATENT DOCUMENTS 6,401,807 B1 * 6/2002 Wyler ................... H01L 23/467
174/16.3
7,463,489 B2  12/2008 Falk et al.
(Continued)

FOREIGN PATENT DOCUMENTS

CN   104641734 B   5/2015
CN   106341052 B   1/2017
(Continued)

OTHER PUBLICATIONS

International Search Report and Written Opinion for International Patent Application No. PCT/US2021/061887, filed Dec. 3, 2021, mailed Apr. 18, 2022.

*Primary Examiner* — Stanley Tso
(74) *Attorney, Agent, or Firm* — Faegre Drinker Biddle & Reath LLP

(57) ABSTRACT

A cooling plate assembly for dual-sided cooling, the cooling plate assembly can include a first cooling plate and a second cooling plate. The first cooling plate that has a first cooling plate connector side and a first cooling plate cooling side that is opposite the first cooling plate connector side. The second cooling plate that has a second cooling plate connector side
(Continued)

and a second cooling plate cooling side that is opposite the second cooling plate connector side. The second cooling plate is configured to attach to the first cooling plate such that formed between the first cooling plate connector side and the second cooling plate connector side is at least one cooling passage through which a cooling fluid is flowed to transfer heat from both the first cooling plate cooling side and the second cooling plate cooling side to the cooling fluid.

17 Claims, 26 Drawing Sheets

(52) U.S. Cl.
CPC ....... *H05K 1/181* (2013.01); *H05K 2201/042* (2013.01); *H05K 2201/064* (2013.01); *H05K 2201/10166* (2013.01); *H05K 2201/1028* (2013.01); *H05K 2201/1031* (2013.01)

(58) Field of Classification Search
USPC ......................................................... 174/252
See application file for complete search history.

(56) References Cited

U.S. PATENT DOCUMENTS

| | | |
|---|---|---|
| 2002/0026996 A1 | 3/2002 | Krieger |
| 2004/0264142 A1* | 12/2004 | Mejia ................. H05K 7/20009 |
| | | 257/E23.101 |
| 2007/0212902 A1* | 9/2007 | Clayton ................. H05K 1/189 |
| | | 439/66 |
| 2008/0105476 A1 | 5/2008 | Korich et al. |
| 2008/0225487 A1 | 9/2008 | Nakajima et al. |
| 2014/0233204 A1 | 8/2014 | Tokuyama et al. |
| 2015/0082821 A1* | 3/2015 | Ganz ................... H01M 10/613 |
| | | 429/120 |
| 2015/0237711 A1 | 8/2015 | Rogers et al. |
| 2017/0033704 A1 | 2/2017 | Lei et al. |
| 2017/0229378 A1* | 8/2017 | Tang ................... H05K 7/20254 |
| 2020/0194336 A1 | 6/2020 | Chang et al. |

FOREIGN PATENT DOCUMENTS

| | | |
|---|---|---|
| KR | 101463784 B1 | 11/2014 |
| WO | 2020074482 A1 | 4/2020 |

\* cited by examiner

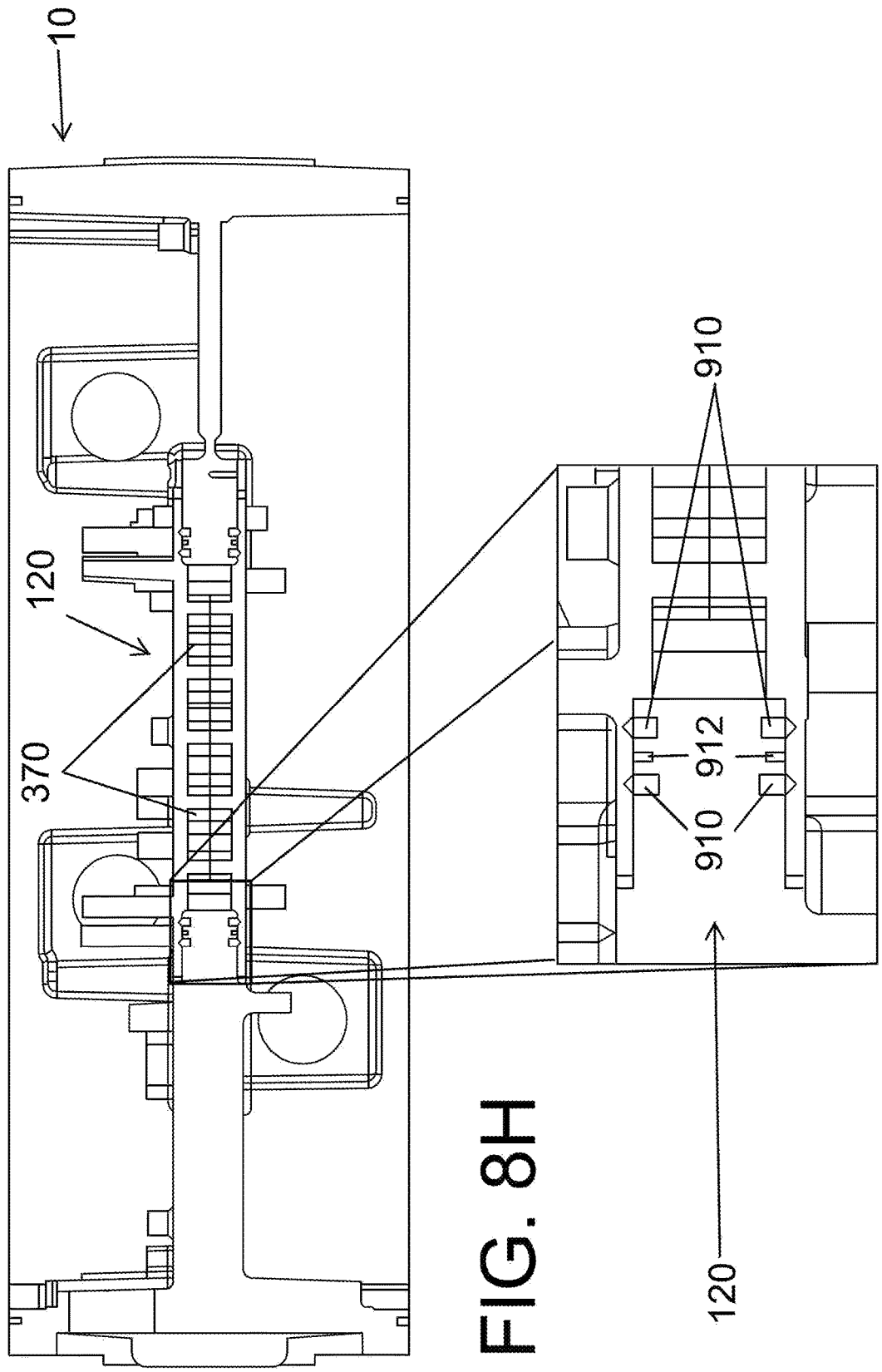

ENCLOSURE ASSEMBLIES, AND RELATED DEVICES AND METHODS

CROSS-REFERENCE TO RELATED APPLICATION

This application claims the priority benefit of International Patent Application No. PCT/US2021/061887, Dec. 3, 2021, which claims priority to U.S. Provisional Application No. 63/120,905 filed on Dec. 3, 2020, the entire contents and disclosures of which are incorporated herein by reference.

FIELD OF THE DISCLOSURE

The present disclosure generally relates to electrical devices for a vehicle, and more specifically, to enclosures and power conversion electrical devices for a vehicle.

BACKGROUND

Propulsion and operation of electric and hybrid vehicles often involves some combination of on-board motors and batteries acting in concert. As with most vehicles, batteries used are often high-voltage, DC-power batteries, which may directly supply electrical power to certain components of the vehicle. Other components of the vehicle may require AC electrical power, and under these circumstances, a traction inverter is used to convert DC power from the batteries into AC power for these components. While often necessary in these applications, typical traction inverters can consume a fair amount of space, which along with efficiency is often a significant design constraint in any vehicle, especially electric and hybrid vehicles. Designs that reduce the space required for components such as traction inverters can provide additional space for more batteries, which can result in extended driving range and performance of electric and hybrid vehicles.

SUMMARY

The present disclosure advantageously provides compact design principles, compact components, and compact arrangements of enclosure assemblies for electrical devices. More specifically, the present disclosure provides compact enclosure assemblies for traction inverters, converters, and other electrical devices used in vehicles or other applications. For example, internal electrical components of the electrical device can be compactly stacked within the enclosure assembly to thereby reduce the footprint of the electrical device. These features can be included in a robust design that is desirable in certain applications of hybrid and/or electric vehicles.

In a first example, an enclosure assembly for an electrical device can include an enclosure body and a cooling plate assembly. The enclosure body can be configured to house components of the electrical device in a component cavity included in the enclosure body. The cooling plate assembly can be arranged at the component cavity and can include a first cooling plate and a second cooling plate. The first cooling plate can have a first cooling plate connector side and a first cooling plate cooling side that is opposite the first cooling plate connector side. The second cooling plate can have a second cooling plate connector side and a second cooling plate cooling side that is opposite the second cooling plate connector side. The second cooling plate can be configured to attach to the first cooling plate such that formed between the first cooling plate connector side and the second cooling plate connector side is at least one cooling passage through which a cooling fluid is flowed to transfer heat from both the first cooling plate cooling side and the second cooling plate cooling side to the cooling fluid.

In further examples of the first example, the enclosure assembly can include a flexible circuit assembly. The flexible circuit assembly can be arranged at the component cavity and attached to the cooling plate assembly. The flexible circuit assembly can include a first circuit member, a second circuit member, and a connector member that can electrically and mechanically connect the first circuit member and the second circuit member. The flexible circuit assembly can be configured to receive the cooling plate assembly between the first circuit member and the second circuit member such that the cooling plate assembly promotes cooling of both the first circuit member and the second circuit member.

Continuing with the first example, a portion of the at least one cooling passage can be formed between the enclosure body and the cooling plate assembly. In examples, both a supply inlet for supplying the cooling fluid to the cooling plate assembly and a supply outlet for expelling the cooling fluid from the cooling plate assembly can be included in the enclosure body. In examples, the electrical device is a traction inverter.

In a second example of the present disclosure, a cooling plate assembly for dual-sided cooling can include a first cooling plate and a second cooling plate. The first cooling plate can have a first cooling plate connector side and a first cooling plate cooling side that is opposite the first cooling plate connector side. The second cooling plate can have a second cooling plate connector side and a second cooling plate cooling side that is opposite the second cooling plate connector side. The second cooling plate can be configured to attach to the first cooling plate such that formed between the first cooling plate connector side and the second cooling plate connector side is at least one cooling passage through which a cooling fluid is flowed to transfer heat from both the first cooling plate cooling side and the second cooling plate cooling side to the cooling fluid.

In further examples of the second example, the at least one cooling passage can include at least two separate cooling passages that have a shared inlet. In examples, the cooling plate assembly can be configured to receive a flow of cooling fluid at a cooling plate assembly inlet side and guide the flow of cooling fluid between the cooling plate assembly inlet side and a cooling plate assembly outlet side via the at least one cooling passage before expelling the flow of cooling fluid at the cooling plate assembly outlet side. A flow splitter can be positioned at the shared inlet and configured to split a flow of cooling fluid between the at least two separate cooling passages. In examples, each cooling passage in the at least one cooling passage can include a plurality of obstructions that is configured to influence a flow of cooling fluid through the at least one cooling passage. In examples, a first obstruction is included in an interior of the cooling passage and a second obstruction is included at a wall of the cooling passage.

Continuing with the second example, at least one of the first cooling plate connector side and the second cooling plate connector side can include a groove with which to receive a sealing gasket that is configured to promote sealing of the at least one cooling passage formed between the first cooling plate connector side and the second cooling plate connector side.

In some such examples, the first cooling plate can be identical to the second cooling plate. In some such examples, the at least one cooling passage can guide a flow of cooling fluid from an interior portion of the cooling plate assembly to an exterior portion of the cooling plate assembly. In examples, the at least two separate cooling passages can be symmetric about a midplane extending through and perpendicular to a length of the cooling plate assembly.

In a third example of the present disclosure, a flexible circuit assembly can include a first circuit member, a second circuit member, and a connector member. The first circuit member can have a first circuit member first side and a first circuit member second side that is opposite first circuit member first side. The second circuit member can have a second circuit member first side and a second circuit member second side. The connector member can be configured to electrically and mechanically connect the first circuit member to the second circuit member such that the first circuit member is in electrical communication with the second circuit member and so as to form a gap therebetween with which to receive a cooling plate assembly that is configured to promote cooling of both the first circuit member first side and the second circuit member first side.

In further examples of the third example, at least one of the first circuit member and the second circuit member comprises a printed circuit board. In examples, the connector member is a ribbon connector. In examples, the first circuit member is the printed circuit board, and the first circuit member first side includes an insulated-gate bipolar transistor.

Continuing with the third example, when the cooling plate assembly is secured between the first circuit member and the second circuit member, the first circuit member and the second circuit member can be substantially parallel to each other. In examples, a periphery of the first circuit member can include a first circuit member first edge, and a periphery of the second circuit member can include a second circuit member first edge. The first circuit member first edge and the second circuit member first edge can be coplanar when the cooling plate assembly is secured between the first circuit member and the second circuit member.

Additional features and advantages of the present disclosure will become apparent to those skilled in the art upon consideration of the following detailed description of the illustrative embodiments exemplifying the disclosure as presently perceived.

BRIEF DESCRIPTION OF THE DRAWINGS

The above-mentioned and other features and advantages of this disclosure, and the manner of obtaining them, will become more apparent, and will be better understood by reference to the following description of the exemplary embodiments taken in conjunction with the accompanying drawings, wherein:

FIG. 8H is an isolated view of the cooling plate and body of the electrical device in FIG. 8A;

FIG. 8I is a close-up view showing a leak detection channel flanked by gaskets in FIG. 8H.

Figure 1A:
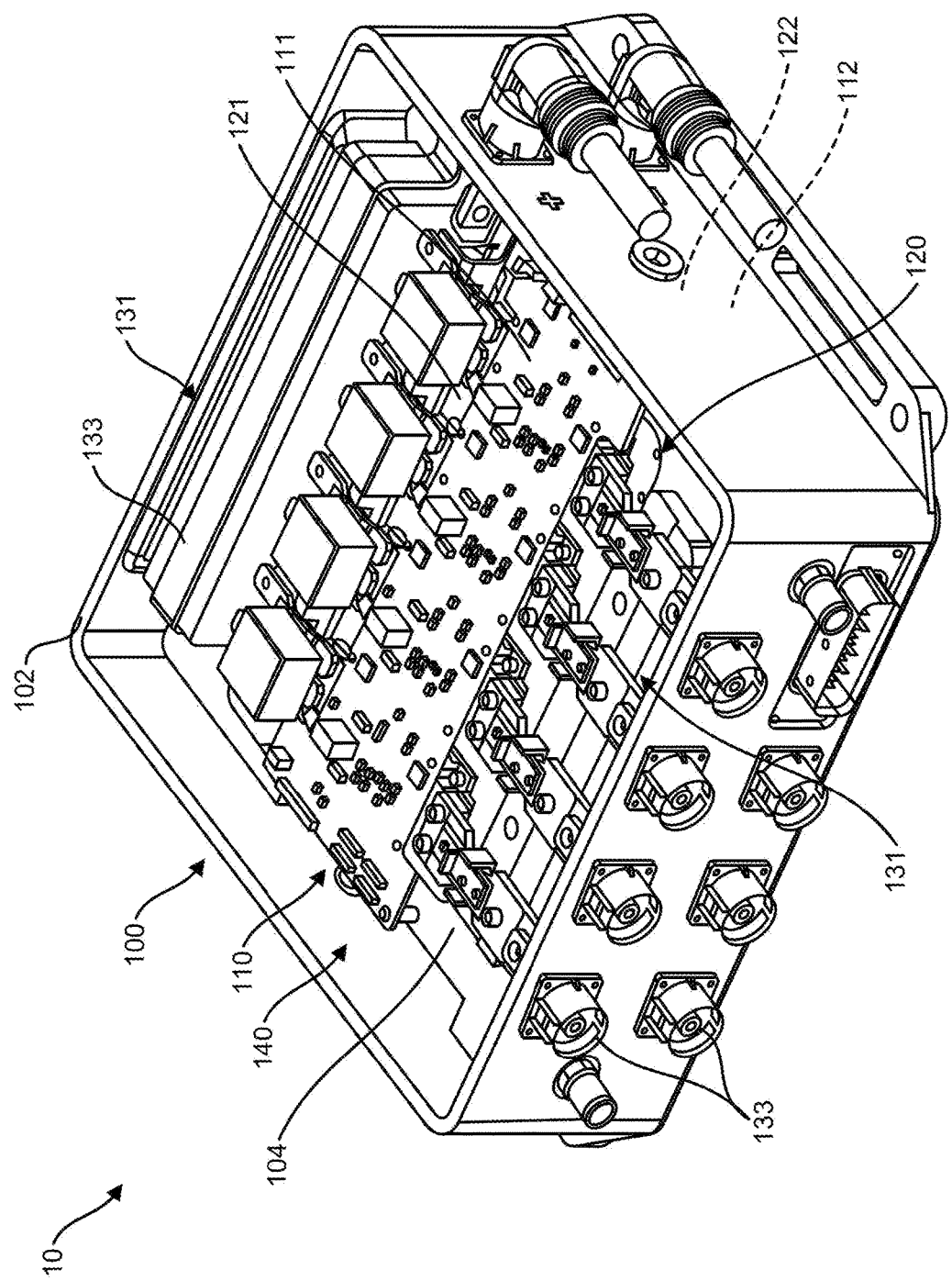
FIG. 1A is a partial cutaway view of an enclosure assembly according to principles of the present disclosure.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present disclosure. The exemplification set out herein illustrates an embodiment of the invention, and such an exemplification is not to be construed as limiting the scope of the invention in any manner.

DETAILED DESCRIPTION OF THE DRAWINGS

For the purposes of promoting an understanding of the principles of the present disclosure, reference is now made to the embodiments illustrated in the drawings, which are described below. The exemplary embodiments disclosed herein are not intended to be exhaustive or to limit the disclosure to the precise form disclosed in the following detailed description. Rather, these exemplary embodiments were chosen and described so that others skilled in the art may utilize their teachings. It is not beyond the scope of this disclosure to have a number (e.g., all) the features in a given embodiment to be used across all embodiments.

Figure 1B:
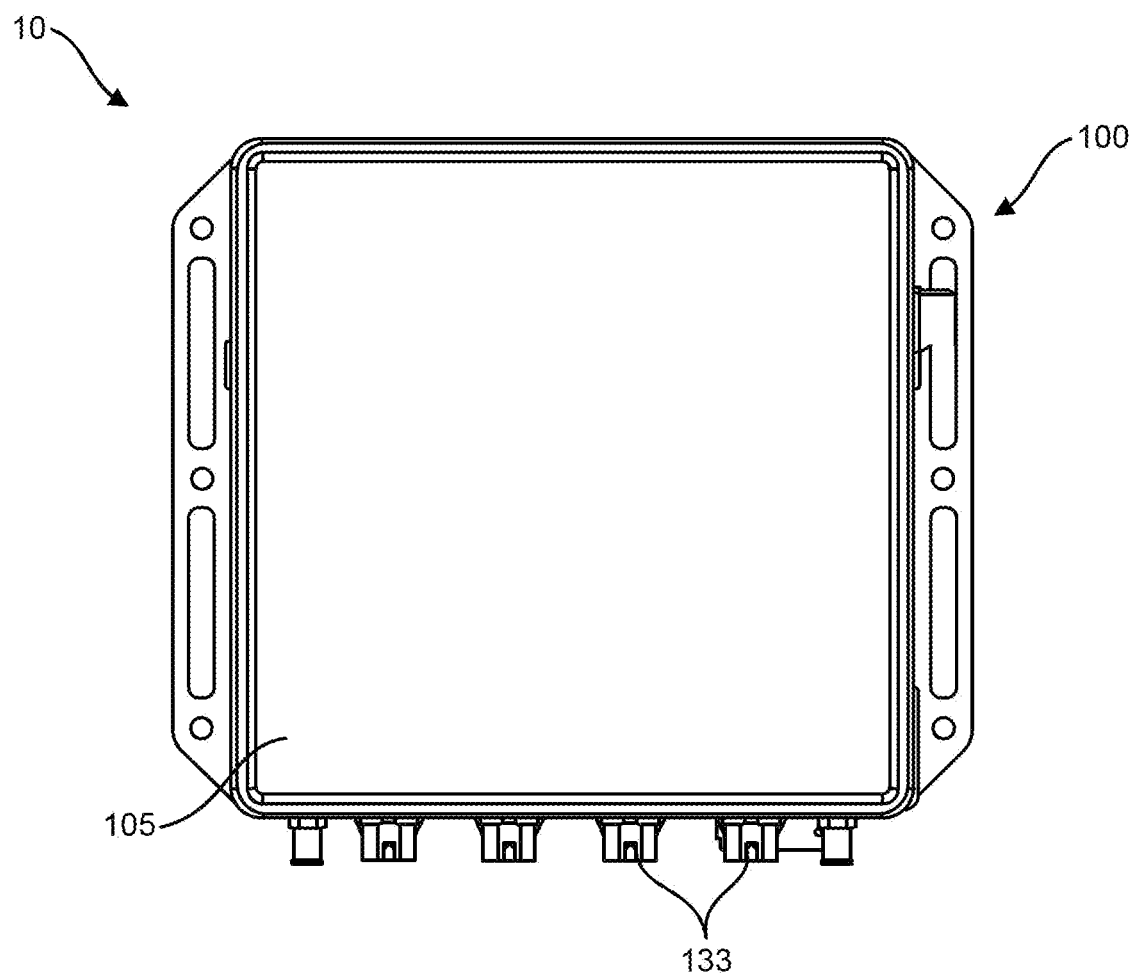
FIG. 1B is a top view of the enclosure assembly shown in FIG. 1A.
Figure 1C:
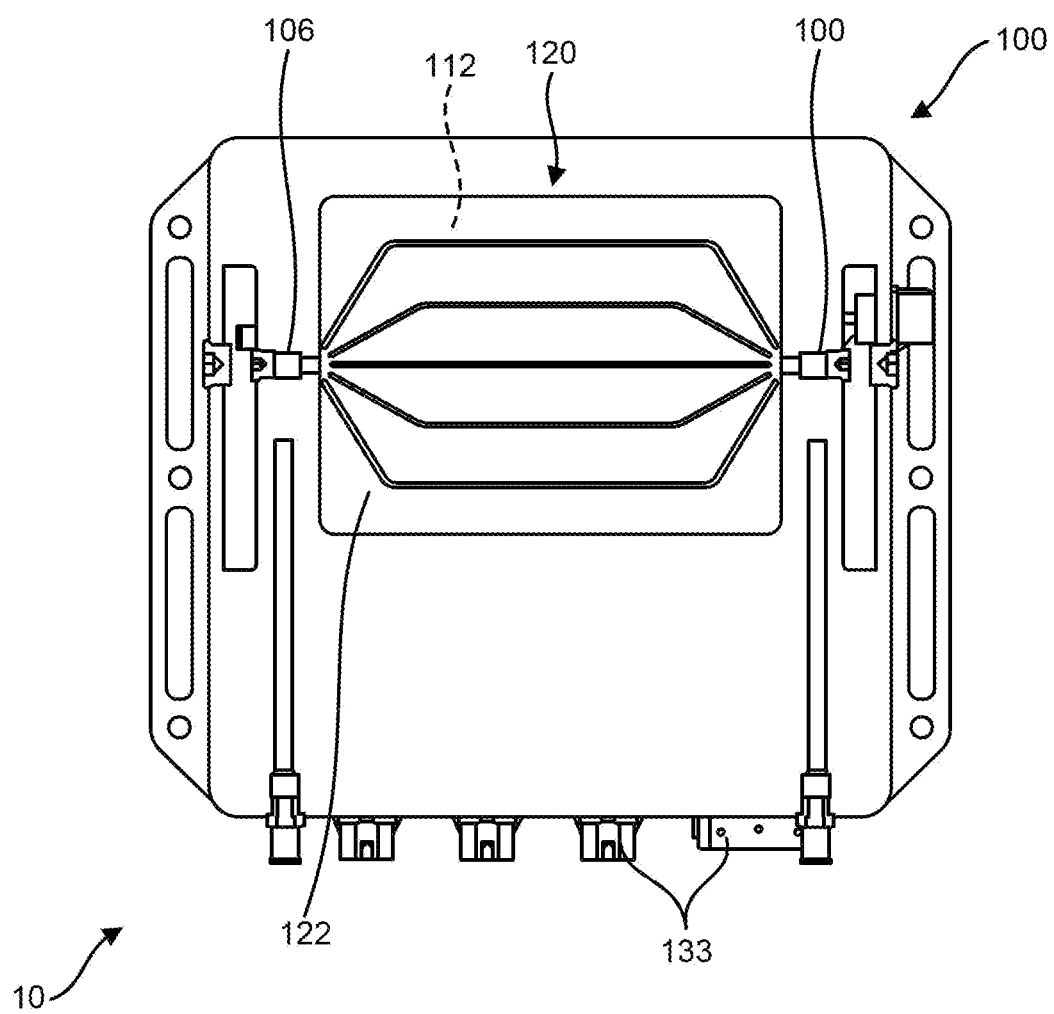
FIG. 1C is a cross-sectional view of the enclosure assembly shown in FIG. 1A taken at a midsection along a height of the enclosure assembly.
Figure 1D:
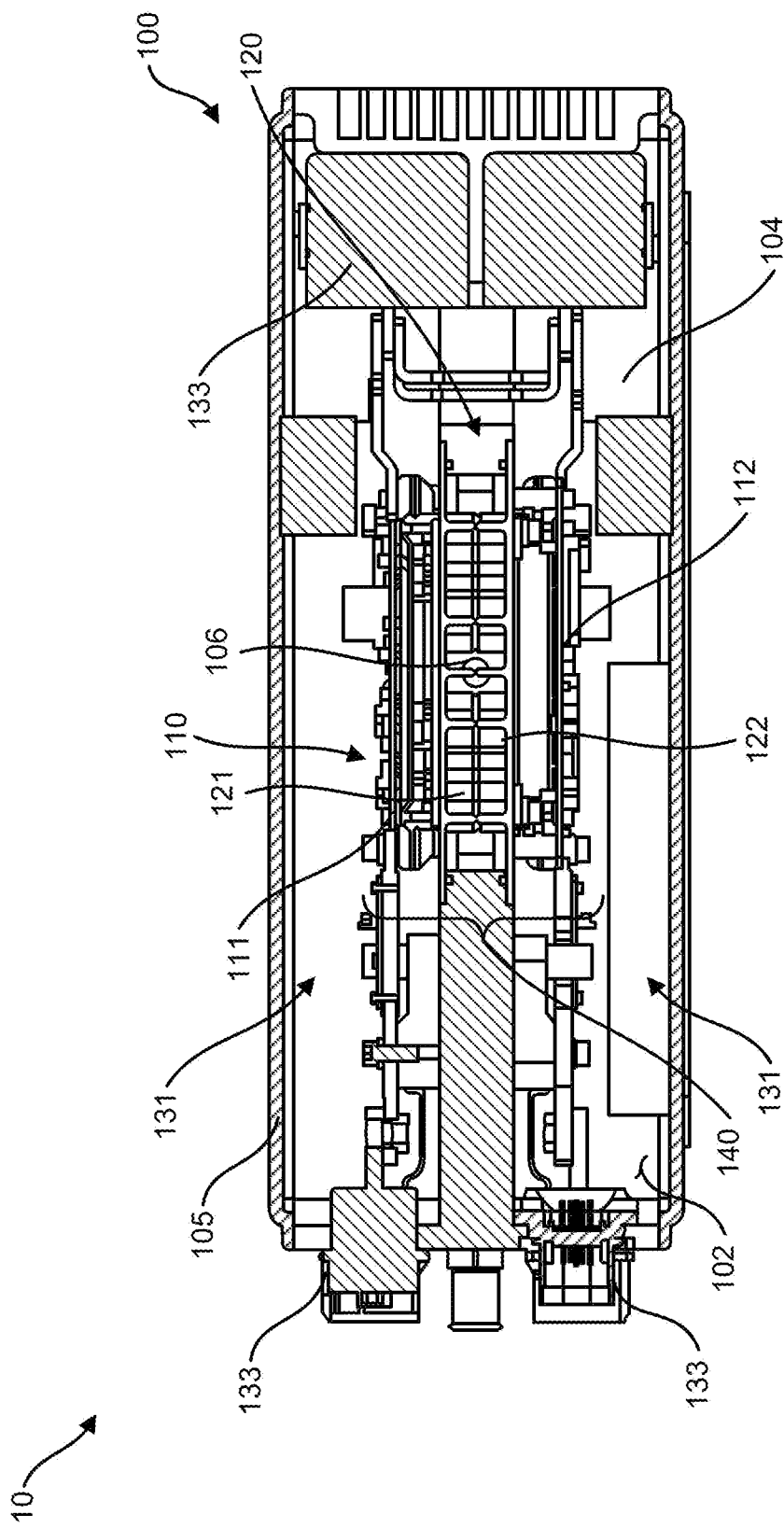
FIG. 1D is a cross-sectional view of the enclosure assembly shown in FIG. 1A taken at a midsection along a width of the enclosure assembly.

FIGS. 1A-1D show various views of an electrical device, according to principles of the present disclosure. FIG. 1A shows a partial cutaway view of an enclosure assembly 100. FIG. 1B shows a top view of the enclosure assembly 100 shown in FIG. 1A. FIG. 1C shows a cross-sectional view of the enclosure assembly 100 shown in FIG. 1A taken at a midsection along a height of the enclosure assembly 100. FIG. 1D shows a cross-sectional view of the enclosure assembly 100 shown in FIG. 1A taken at a midsection along a width of the enclosure assembly 100. Although discussed in relation to one type of electrical device (e.g., a traction inverter), it should be understood that one skilled in the art will appreciate that enclosures and related enclosure methods disclosed herein are applicable across a variety of electrical devices, including power conversion (e.g., inverters, converter), computing, and other similar devices.

For illustrative purposes, FIGS. 1A-1D show a traction inverter 10 that employs principles of the present disclosure. An enclosure assembly 100 for an electrical device, such as the shown traction inverter 10, can include an enclosure body 102, a component cavity 104 formed at the enclosure body 102, and a cover 105 for covering the component cavity 104. The enclosure body 102 can include a supply inlet 106 and a supply outlet 108. The enclosure assembly 100 can include a flexible circuit assembly 110 that has a first circuit member 111 and a second circuit member 112. As used herein, the flexible circuit assembly can refer to foldability between two semi-rigid or rigid circuit members (e.g., first and second circuit members 111, 112) and/or flexible circuit members (e.g., first and second circuit members 111, 112). As well, the enclosure assembly 100 can include a cooling plate assembly 120 that has a first cooling plate 121 and second cooling plate 122. These components of the enclosure assembly 100 will be discussed in further detail hereinafter.

The enclosure body 102 can be configured to house components of the electrical device in the component cavity 104 included in the enclosure body 102. As shown, a flexible circuit assembly 110 connects internal electrical components 131 to each other and/or to external connectors 133. Due to the flexibility of the flexible circuit assembly 110, a footprint of the enclosure assembly 100 can be reduced because, for example, the flexible circuit assembly 110 can be folded within the enclosure assembly 100 (instead of having to extend longitudinally therein). The flexible circuit assembly 110 can be arranged at the component cavity 104 and, for cooling the internal electrical components 131, attached to the cooling plate assembly 120 (the details of which will be discussed further below). The flexible circuit assembly 110 can be configured to receive the cooling plate assembly 120 between a first circuit member 111 and the second circuit member 112 such that the cooling plate assembly 120 promotes cooling of both a first circuit member 111 and the second circuit member 112. As shown here, a capacitor 133 included in the internal electrical components 131 can be a brick-type capacitor 133, but as discussed further hereinafter, other types of capacitors 133 may be employed based on the desires and constraints in a particular application.

Temperature regulation of internal electrical components 131 ensure their proper performance. In this regard, the enclosure assembly 100 can facilitate cooling of internal electrical components 131 within the enclosure, especially those internal electrical components 131 that are most sensitive to high temperatures. The cooling plate assembly 120 can be arranged at the component cavity 104 and can include a first cooling plate 121 and a second cooling plate 122, which mate together to form the cooling plate assembly 120. The flexible circuit assembly 110 can attach to the cooling plate assembly 120. For example, as discussed above, the cooling plate assembly 120 can be arranged between first and second circuit members 111, 112 of the flexible circuit assembly 110. In this way, a stack 140 (e.g., comprising the first circuit member 111, the first cooling plate 121, the second cooling plate 122, and the second circuit member 112) can be formed and arranged within the component cavity 104 to make with portions of the enclosure body 102. In examples, as noted above, both the supply inlet 106 for supplying the cooling fluid to the cooling plate assembly 120 and the supply outlet 108 for expelling the cooling fluid from the cooling plate assembly 120 can be included in the enclosure body 102.

Figure 2A:
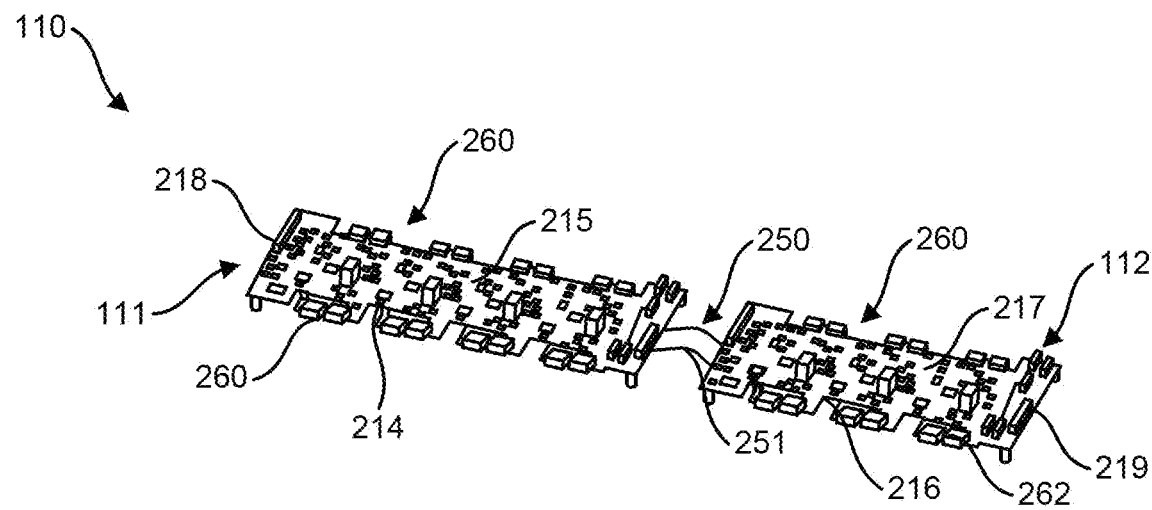
FIG. 2A is a perspective view of a flexible circuit assembly according to principles of the present disclosure.
Figure 2B:
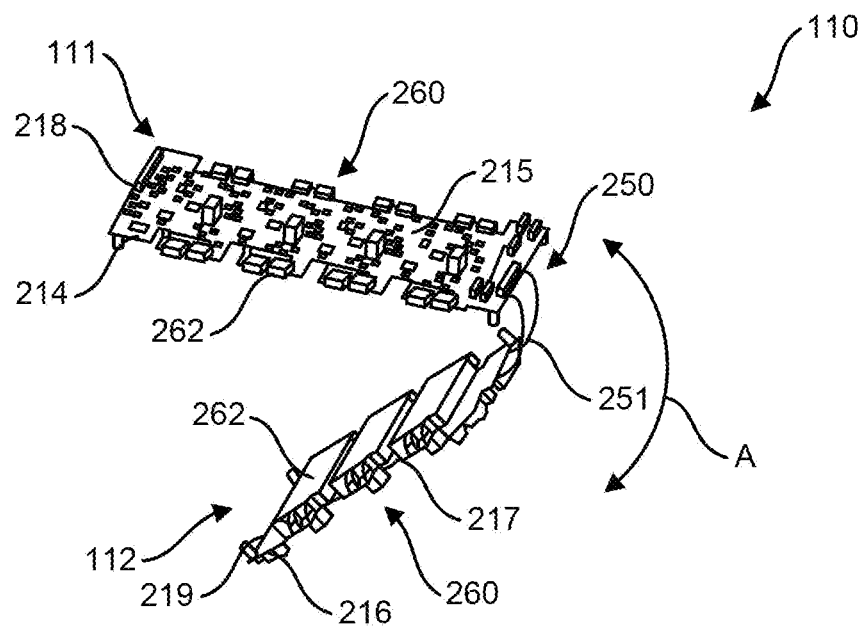
FIG. 2B is a perspective view of the flexible circuit assembly in FIG. 2A during a folding step.
Figure 2C:
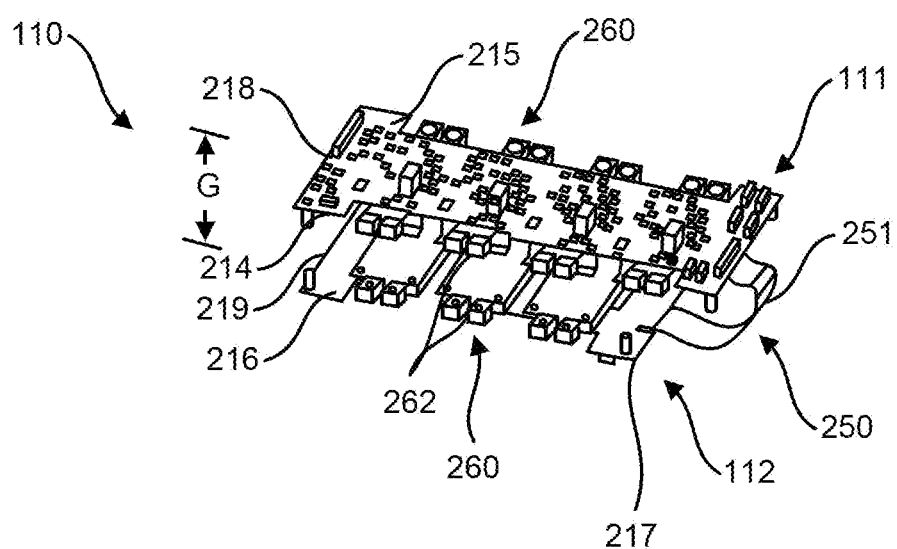
FIG. 2C is a perspective view of the flexible circuit assembly in FIG. 2A after a folding step.

FIGS. 2A-2C show various views of a flexible circuit assembly 110 according to principles of the present disclosure. FIG. 2A shows a perspective view of the flexible circuit assembly 110. FIG. 2B shows a perspective view of the flexible circuit assembly 110 in FIG. 2A during a folding step. FIG. 2C shows a perspective view of the flexible circuit assembly 110 in FIG. 2A after a folding step.

Flexibility of the flexible circuit assembly 110 can be encouraged by its construction. As noted above, the flexible circuit assembly 110 can be configured to receive the cooling plate assembly between the first circuit member 111 and the second circuit member 112 such that the cooling plate assembly promotes cooling of both the first circuit member 111 and the second circuit member 112. A connector member 250 included in the flexible circuit assembly 110 can electrically and mechanically connect the first circuit member 111 and the second circuit member 112. The connector member 250 can be flexible and can be configured to electrically and mechanically connect the first circuit member 111 to the second circuit member 112 such that the first circuit member 111 is in electrical communication with the second circuit member 112.

In an example, the connector member 250 can allow the first circuit member 111 to be folded over and/or under (as indicated by arrow "A") the second circuit member 112 while allowing electrical communication therebetween. Under these circumstances, a gap "G" with which to receive a cooling plate assembly can be formed between the first and second circuit members 111, 112. The first circuit member 111 can have a first circuit member first side 214 and a first circuit member second side 215 that is opposite first second member first side, and the second circuit member 112 can have a second circuit member first side 216 and a second circuit member second side 217. By virtue of its position between the first and second circuit members 111, 112, for example, the cooling plate assembly can be configured to promote cooling of both the first circuit member first side 214 and the second circuit member first side 216.

As noted above, the flexible circuit assembly 110 can include printed circuit boards 260. Thus, in some examples, at least one of the first circuit member 111 and the second circuit member 112 can include a printed circuit board 260 (e.g., a 3- or 4-phase printed circuit board 260). When the first circuit member 111 is the printed circuit board 260, the first circuit member first side 214 can include an insulated-gate bipolar transistor ("IGBT") 172. In other examples, both the first circuit member 111 and the second circuit member 112 comprise a printed circuit board 260. Under these circumstances, both the first circuit member first side 214 and the second circuit member first side 216 can include an IGBT 262. In this regard, the first and second circuit members 111, 112 can be different printed circuit boards 260 (e.g., a 4-phase IGBT board and a 3-phase IGBT board) or the same printed circuit boards 260. Connecting the first and second circuit members 111, 112, for instance when both are printed circuit boards 260, is the connector member 250 in the form of a ribbon connector 251. Under these circumstances, the connector member 250 can attach to receptacles on both printed circuit boards 260 to thereby electrically and mechanically connect both printed circuit boards 260 for operation of the electrical device. When assembled, the connector ribbon can avoid contacting the cooling plate assembly by wrapping around the cooling plate assembly such that the cooling plate assembly and connector member 250 are spaced apart.

Careful arrangement of components within the stack can ensure a compact design thereof but may also result in potential areas for thermal hotspots during operation. In examples, when the cooling plate assembly is secured between the first circuit member 111 and the second circuit member 112, the first circuit member 111 and the second circuit member 112 can be substantially parallel to each other. In examples, a periphery of the first circuit member 111 can include a first circuit member first edge 218, and a periphery of the second circuit member 112 can include a second circuit member first edge 219. The first circuit member first edge 218 and the second circuit member first edge 219 can be coplanar when the cooling plate assembly is secured between the first circuit member 111 and the second circuit member 112. This example is just one of many examples. In that regard, any edges of the flexible circuit member 111 can be aligned to fit a desired application. Arranging the first and second circuit members 111, 112 in this fashion can result in corresponding sides of the first and second connector members that produce heat to confront one another, which can increase operating temperatures there at. During operation in this arrangement, internal electrical components such as the IGBT 262 will generate heat, which should be removed so that the internal electrical components can operate at a safe working temperature that does not significantly detriment their performance.

Figure 3A:
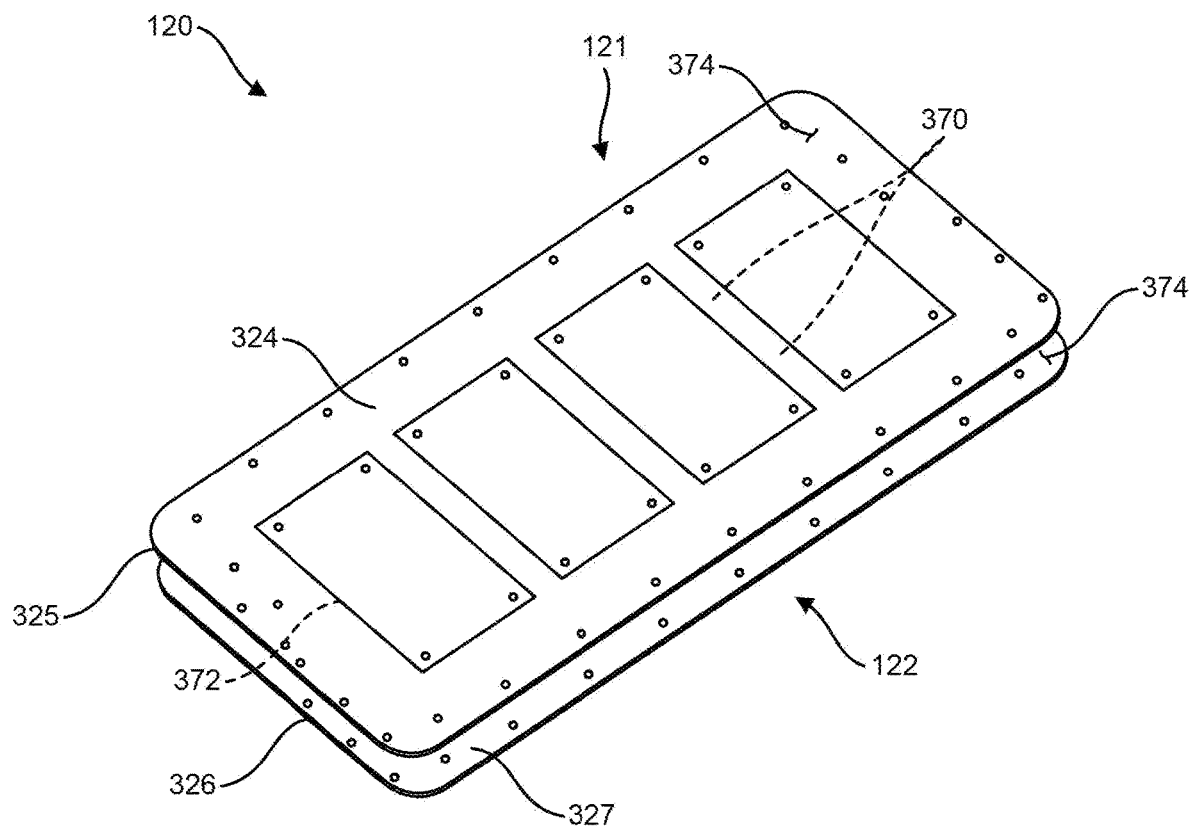
FIG. 3A is a perspective view of a cooling plate assembly according to principles of the present disclosure.
Figure 3B:
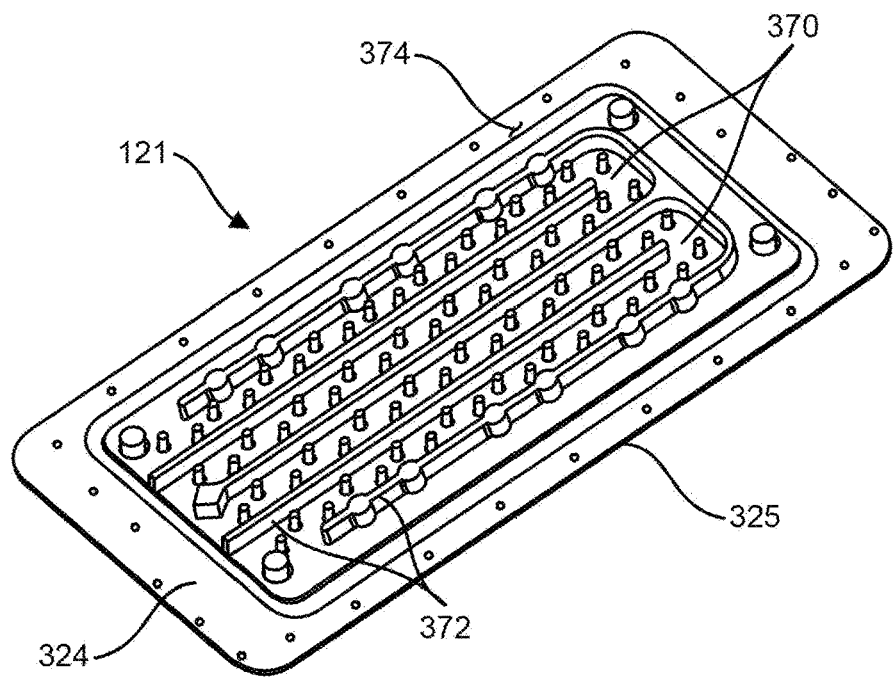
FIG. 3B is a perspective view of a first cooling plate of the cooling plate assembly shown in FIG. 3A.
Figure 3C:
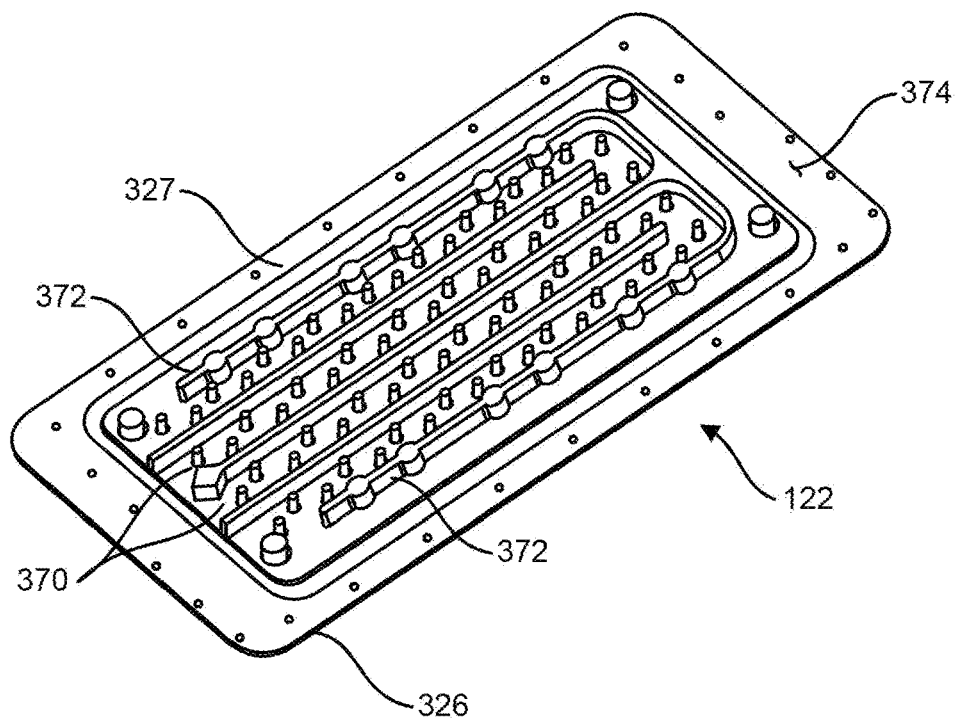
FIG. 3C is a perspective view of a second cooling plate of the cooling plate assembly shown in FIG. 3A.

FIGS. 3A-3C show various views of a cooling plate assembly 120 according to principles of the present disclosure. FIG. 3A shows a perspective view of the cooling plate assembly 120. FIG. 3B shows a perspective view of a first cooling plate 121 of the cooling plate assembly 120 shown in FIG. 3A. FIG. 3C shows a perspective view of a second cooling plate 122 of the cooling plate assembly 120 shown in FIG. 3A.

Proper cooling of internal electric components can occur via the cooling plate assembly 120. In examples, as noted above, the cooling plate assembly 120 can be arranged at the component cavity and can include a first cooling plate 121 and a second cooling plate 122. The first cooling plate 121 can have a first cooling plate cooling side 324 and a first cooling plate connector side 325 that is opposite the first cooling plate cooling side 324. The second cooling plate 122 can have a second cooling plate cooling side 326 and a second cooling plate connector side 327 that is opposite the second cooling plate cooling side 326. The second cooling plate 122 can be configured to attach to the first cooling plate 121 such that formed between the first cooling plate connector side 325 and the second cooling plate connector side 327 is at least one cooling passage 370 through which a cooling fluid is flowed to transfer heat from both the first cooling plate cooling side 324 and the second cooling plate cooling side 326 to the cooling fluid. In examples, a portion of the at least one cooling passage 370 can be formed between the enclosure body and the cooling plate assembly 120 (as can be seen in FIG. 4).

For manufacturing purposes, each of the first and second cooling plates 121, 122 can be formed via casting process. For example, the first and second cooling plates 121, 122 can be cast aluminum or another similar metal. Portions of the first and second cooling plates 121, 122 that form the at least one cooling passage 370 can be in the form of protruding portions extending (e.g., generally upwardly) from a base 374 of at least one of the first and second cooling plates 121, 122. In this manner, the first and second cooling plates 121, 122 can have mating surfaces that do not penetrate the other of the first and second cooling plates 121, 122. In other examples, mating surfaces of the first and second cooling plates 121, 122 can penetrate each other in one way (e.g., the first cooling plate 121 penetrates the second cooling plate 122) or both ways (the first and second cooling plates 121, 122 penetrate each other). In any of these instances, walls 372 of the at least one cooling passage 370 formed between the first and second cooling plates 121, 122 can be sealed Proper sealing of the cooling plate can prevent unintended, damaging leaks. In this regard, at least one of the first cooling plate connector side 325 and the second cooling plate connector side 327 can include a groove (not shown) with which to receive a sealing gasket (not shown) that is configured to promote sealing of the at least one cooling passage 370 formed between the first cooling plate connector side 325 and the second cooling plate connector side 327. The sealing gasket can be any gasket made from a material now known or later invented so long as the sealing gasket seals the walls 372 of the at least one cooling passage 370.

Figure 4:
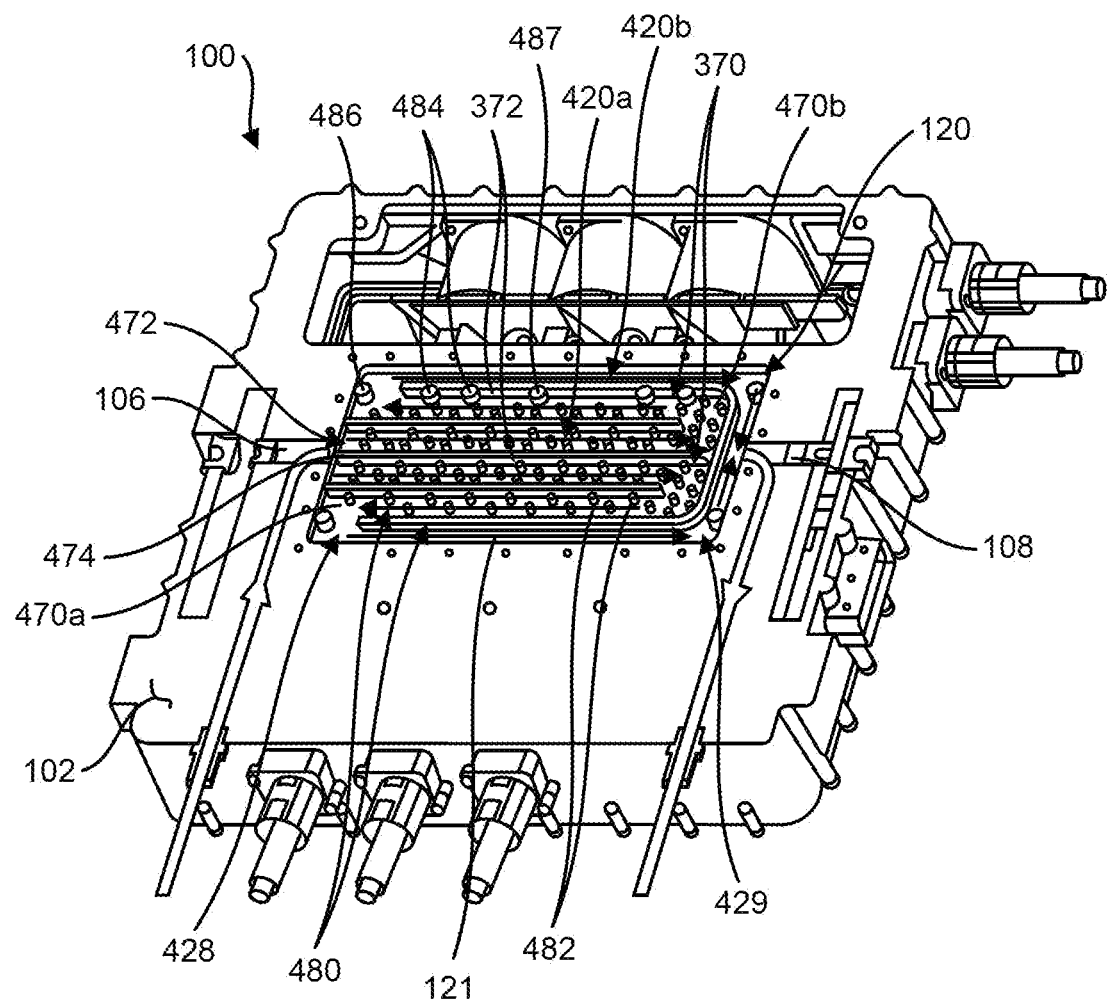
FIG. 4 is a flow diagram of cooling fluid flowing through an enclosure assembly according to principles of the present disclosure.

FIG. 4 shows a flow diagram of cooling fluid flowing through an enclosure assembly 100 according to principles of the present disclosure.

As noted above, cooling fluid and flow between the enclosure body 102 and the cooling plate assembly 120. For illustration purposes, the cooling plate assembly 120 shown here has an inner portion 420a, an outer portion 420b, a cooling plate assembly inlet side 428, and a cooling plate assembly outlet side 429. The cooling plate assembly inlet side 428 can be positioned proximate to the supply inlet 106 of the enclosure body 102, and the cooling plate assembly outlet side 429 can be positioned proximate to the supply outlet 108 of the enclosure body 102. In examples, the cooling plate assembly 120 can be configured to receive a flow of cooling fluid at a cooling plate assembly inlet side 428 and guide the flow of cooling fluid between the cooling plate assembly inlet side 428 and a cooling plate assembly outlet side 429 via the at least one cooling passage 370 before expelling the flow of cooling fluid at the cooling plate assembly outlet side 429. In examples, the at least one cooling passage 370 can guide a flow of cooling fluid from an inner portion 420a of the cooling plate assembly 120 to an outer portion 420b of the cooling plate assembly 120. As well, the at least one cooling passage 370 may be configured such that the rate of flow of the cooling fluid is slowed or quickened so as to vary the rate of cooling at the corresponding portion.

In examples, the at least one cooling passage 370 can include at least two separate cooling passages 470a, 470b that have a shared inlet 472. A flow splitter 474 can be positioned at the shared inlet 472 and configured to split a flow of cooling fluid between the at least two separate cooling passages 470a. The flow splitter 474 can be positioned proximate to and confront the supply inlet 106 (e.g. at the cooling plate inlet side). In the illustrated embodiment, the flow splitter 474 is shown as an end of a longitudinally extending wall 372 of the at least one cooling passage 370. It is noted that the flow splitter 474 can also be separate from walls 372 of the at least one cooling passage 370. The thickness of the flow splitter 474 can taper toward the supply inlet 106 so as to promote splitting of the supplied flow of cooling fluid. While the illustrated embodiment shows the flow splitter 474 bisecting the fluid flow, in other embodiments the flow splitter 474 may be eccentrically located so as to vary a split of the flow of cooling fluid.

In examples, each cooling passage in the at least one cooling passage 370 can include a plurality of obstructions 480 that is configured to influence a flow of cooling fluid through the at least one cooling passage 370. Obstructions 480, for example, can be in the form of stems 482 partially or fully extending along a height and within a cooling passage or protrusions 484 from walls 372 of the cooling pack passage. obstructions 480 may vary in size and shape depending on applications thereof obstructions 480 may be arranged in a pattern (e.g., one or more rows or one or more groupings). In examples, a first obstruction 486 is included in an interior of the at least one cooling passage 370 and a second obstruction 487 is included at a wall 372 of the at least one cooling passage 370.

Symmetry of the cooling plate assembly 120 can promote efficient manufacturing and operation processes. In examples, the first cooling plate 121 can be identical to the second cooling plate. Under these circumstances, the same cooling plate can be manufactured to be either the first cooling plate 121 or the second cooling plate. Thus, for instance, manufacturing and replacement cost can be minimized. In examples, the at least two separate cooling passages 470a can be symmetric about a midplane extending through and perpendicular to a length of the cooling plate assembly 120. In this manner, the cooling plate assembly 120 can promote equal distribution of the cooling fluid flow, for example when the flow splitter 474 bisects the flow of cooling fluid from the supply inlet 106. Thus, equal cooling of the cooling plate assembly 120 can be achieved. It is noted, however, that while symmetry has a number of advantages as listed here, this disclosure also contemplates a first cooling plate 121 that is asymmetric to the second cooling plate for particular applications.

Figure 5:
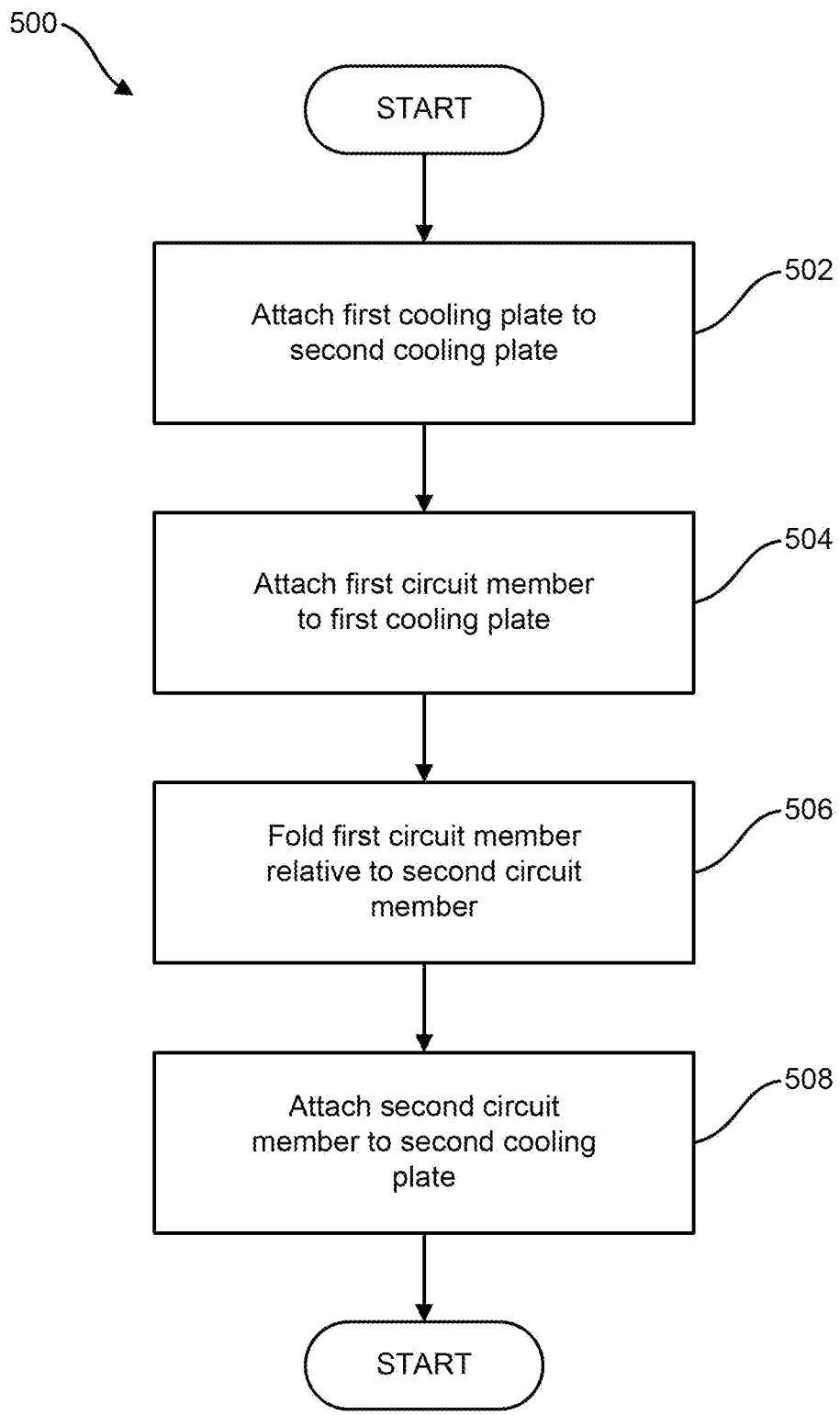
FIG. 5 is a flowchart of a method of assembling a stack comprising both a flexible circuit assembly and a cooling plate assembly according to principles of the present disclosure.

FIG. 5 shows a flowchart of a method 500 of assembling a stack comprising both a flexible circuit assembly and a cooling plate assembly according to principles of the present disclosure.

As alluded to above, the present disclosure also includes a method 500 of assembling a stack comprising a flexible circuit assembly and a cooling plate assembly. The flexible circuit assembly and the cooling plate assembly can be similar to those disclosed elsewhere herein, including the flexible circuit assembly 110 and the cooling plate assembly 120. At step 502, the method 500 can include attaching the first cooling plate to the second cooling plate. At step 504, the method 500 can include attaching a first circuit member of the flexible circuit assembly to a first cooling plate of the cooling plate assembly. At step 506, the method 500 can include folding the first circuit member relative to (e.g. over or under) the second circuit member. At step 508, the method 500 can include attaching a second circuit member of the flexible circuit assembly to a second cooling plate of the cooling plate assembly. In some examples, this folding step 506 may be preceded by attaching the first cooling plate to the second cooling plate at step 502 while in other examples, the folding step 506 may be subsequent to attaching the first cooling plate to the second cooling plate at step 502 as shown. In this manner a stack can be assembled and then arranged within an enclosure assembly. The enclosure assembly can be similar to those discussed elsewhere herein, including the enclosure assembly 100.

It is well understood that methods that include one or more steps, the order listed is not a limitation of the claim unless there are explicit or implicit statements to the contrary in the specification or claim itself. It is also well settled that the illustrated methods are just some examples of many examples disclosed, and certain steps may be added or omitted without departing from the scope of this disclosure. Such steps may include incorporating devices, systems, or methods or components thereof as well as what is well understood, routine, and conventional in the art.

Figure 6A:
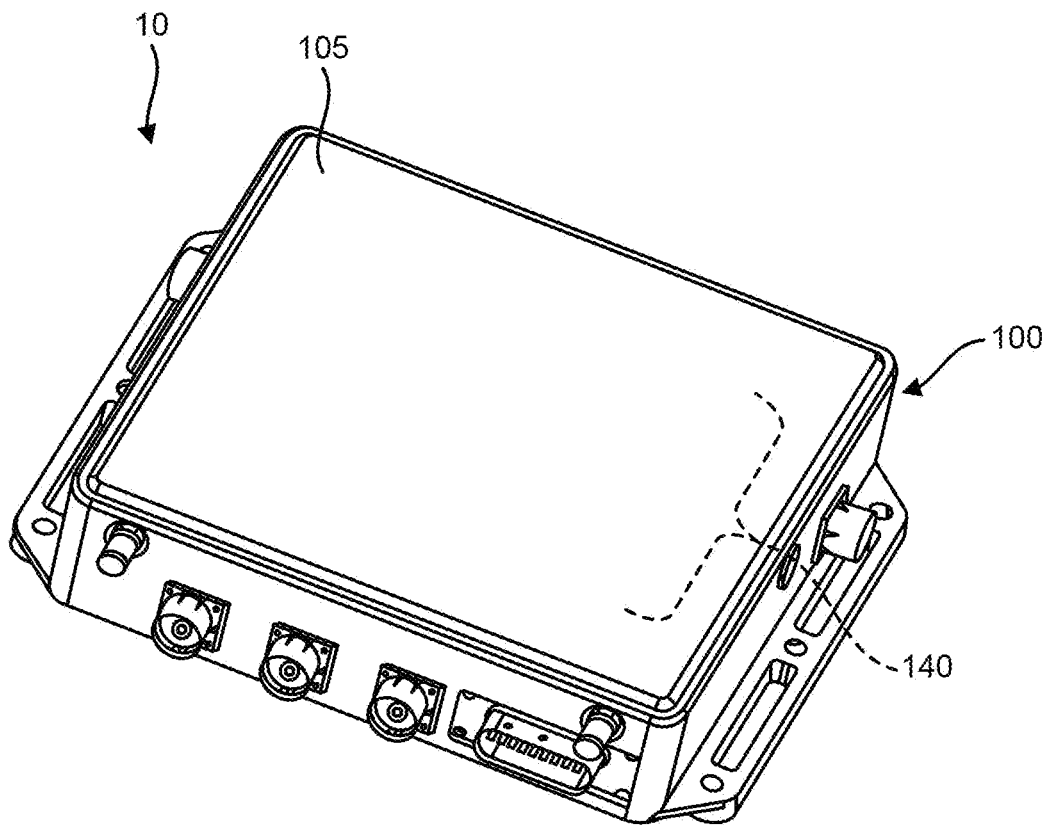
FIG. 6A is a perspective view of an enclosure assembly with an individual printed circuit board according to principles of the present disclosure.
Figure 6B:
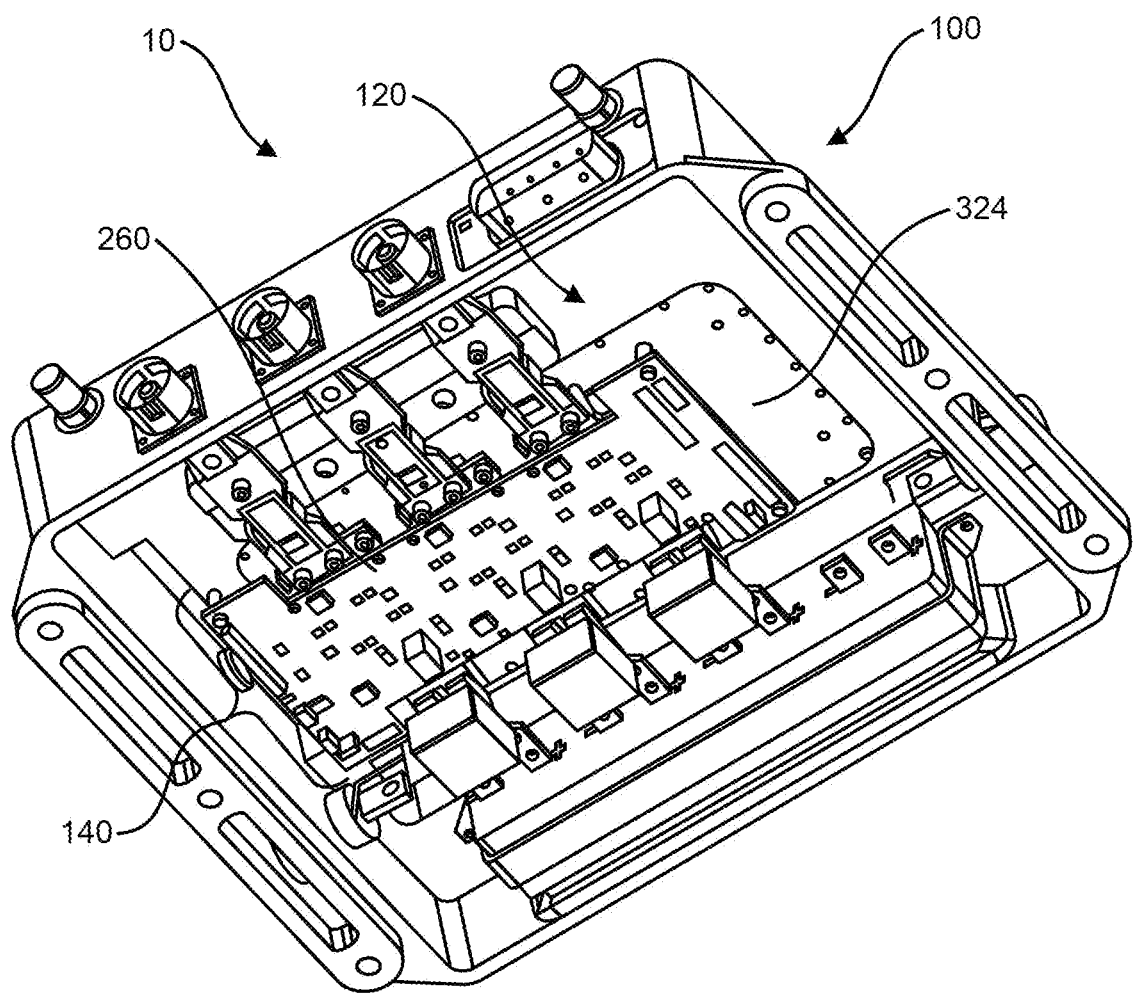
FIG. 6B is another perspective view of the enclosure assembly shown in FIG. 6A.
Figure 6C:
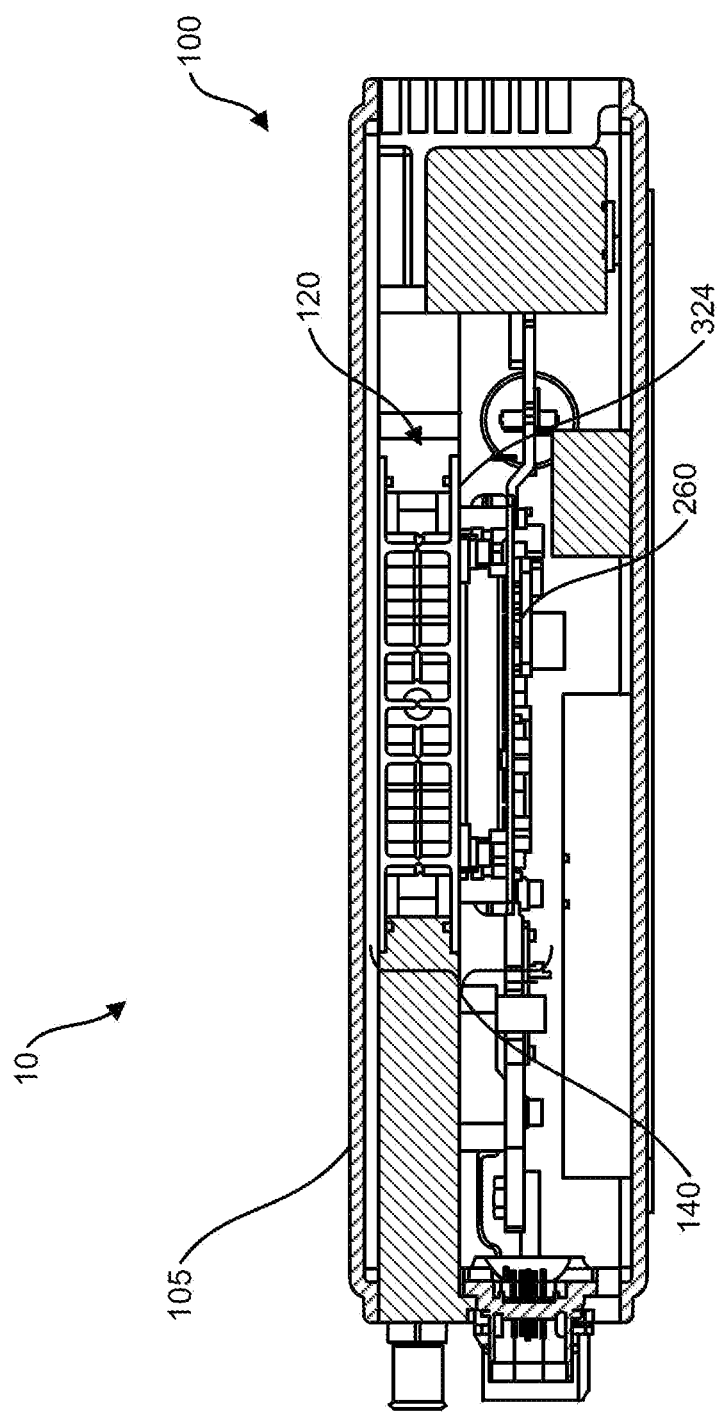
FIG. 6C is a cross-sectional view of the enclosure assembly shown in FIG. 6A taken at a midsection along a width of the enclosure assembly.

The remaining figures show other examples of principles of the present disclosure. FIGS. 6A-6C show further examples of the electrical device 10 according to principles of the present disclosure. FIG. 6A shows a perspective view of an enclosure assembly 100 with an individual printed circuit board 260. FIG. 6B shows another perspective view of the enclosure assembly 100 shown in FIG. 6A. FIG. 6C shows a cross-sectional view of the enclosure assembly 100 shown in FIG. 6A taken at a midsection along a width of the enclosure assembly 100.

For example, FIGS. 6A-6C show an embodiment of the enclosure assembly 100 where an individual printed circuit board 260 is employed in the stack 140 instead of a flexible circuit board. With this example, the individual printed circuit board 260 can be attached to one side (e.g., the first cooling plate cooling side 324) of the cooling plate assembly 120 to form the stack 140, and the stack 140 can be arranged within the enclosure cavity. As shown, the cooling plate assembly 120 is attached to the cover 105, but it is noted that the cooling plate assembly 120 can be attached elsewhere in the enclosure assembly 100.

Figure 7A:
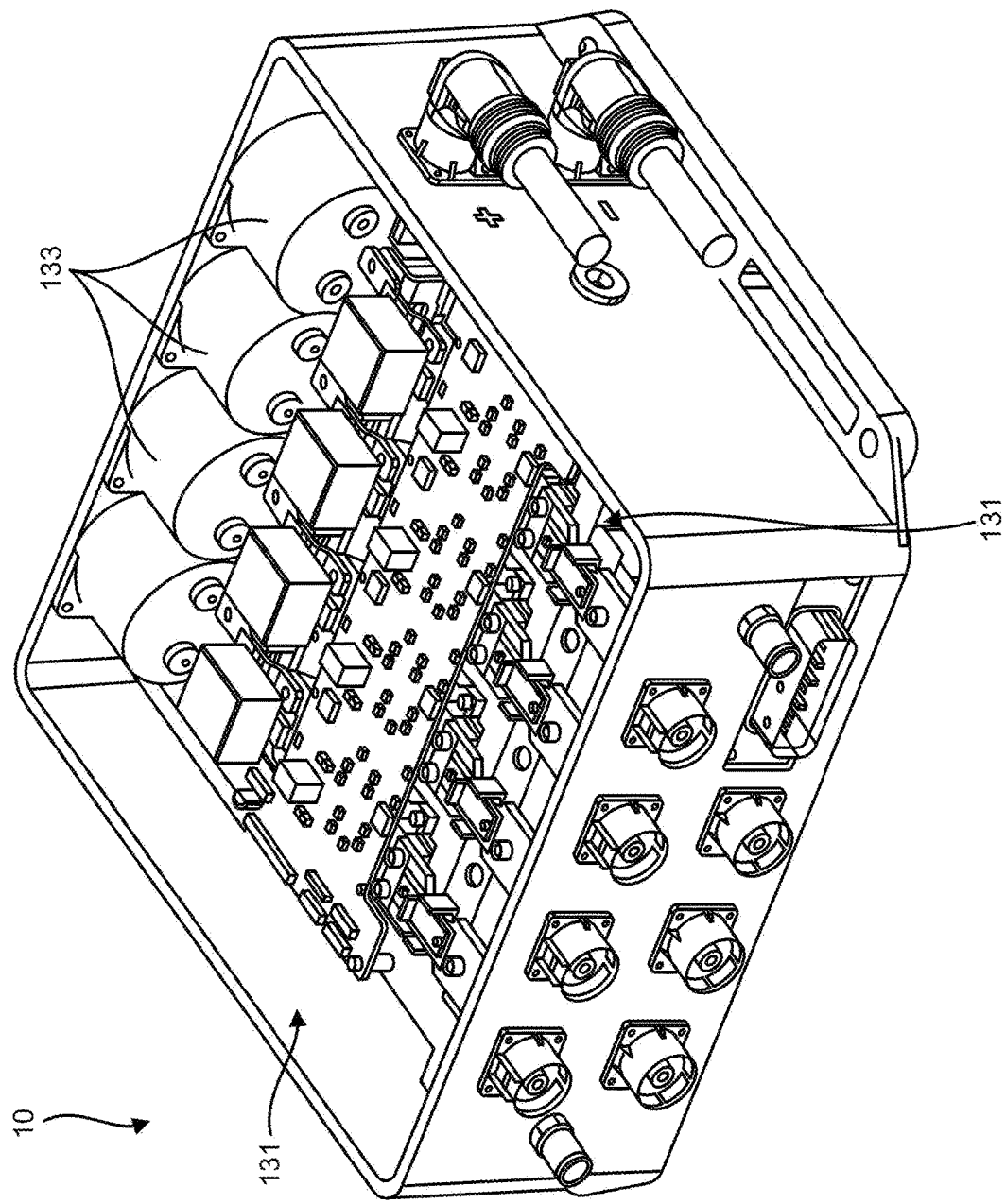
FIG. 7A is a partial cutaway view of an enclosure assembly employing cylindrical capacitors according to principles of the present disclosure.
Figure 7B:
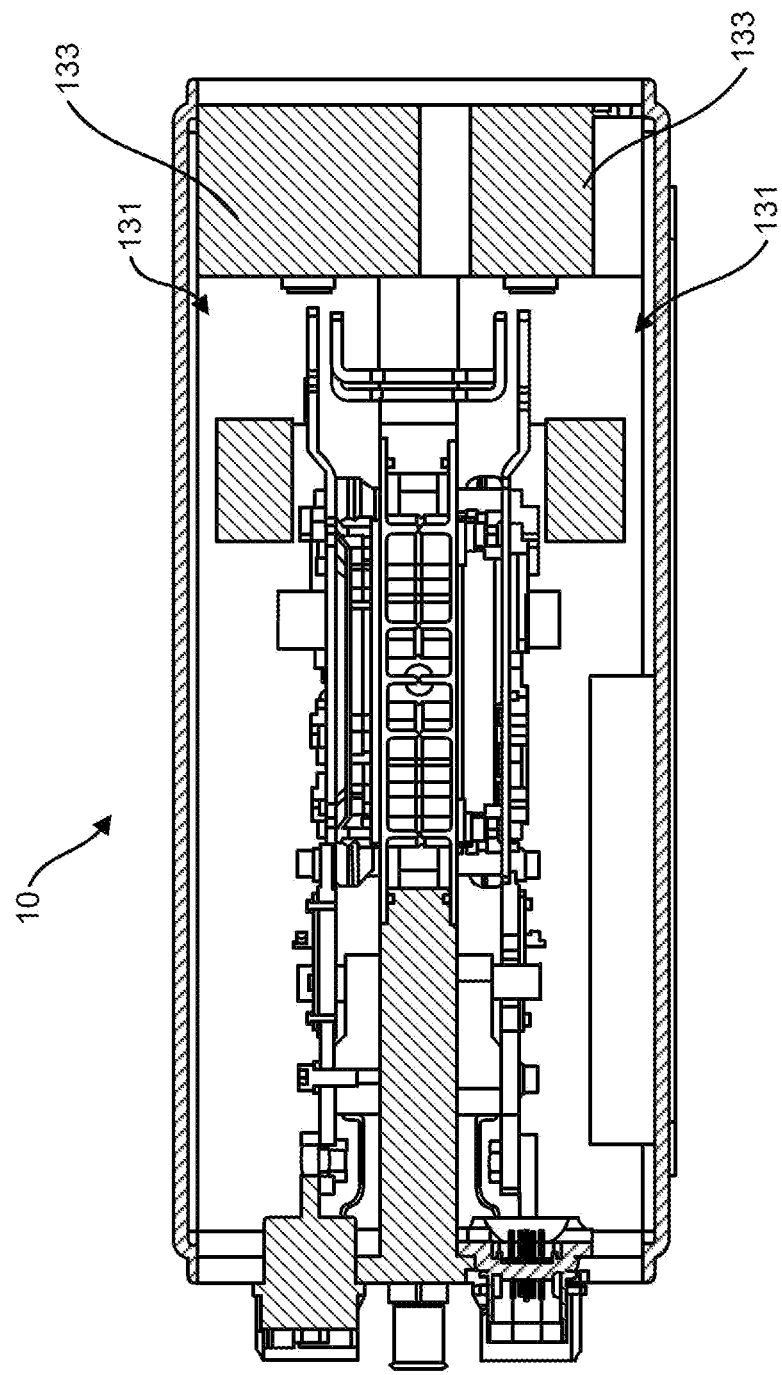
FIG. 7B is a cross-sectional view of the enclosure assembly shown in FIG. 7A taken at a midsection along a width of the enclosure assembly.
Figure 7C:
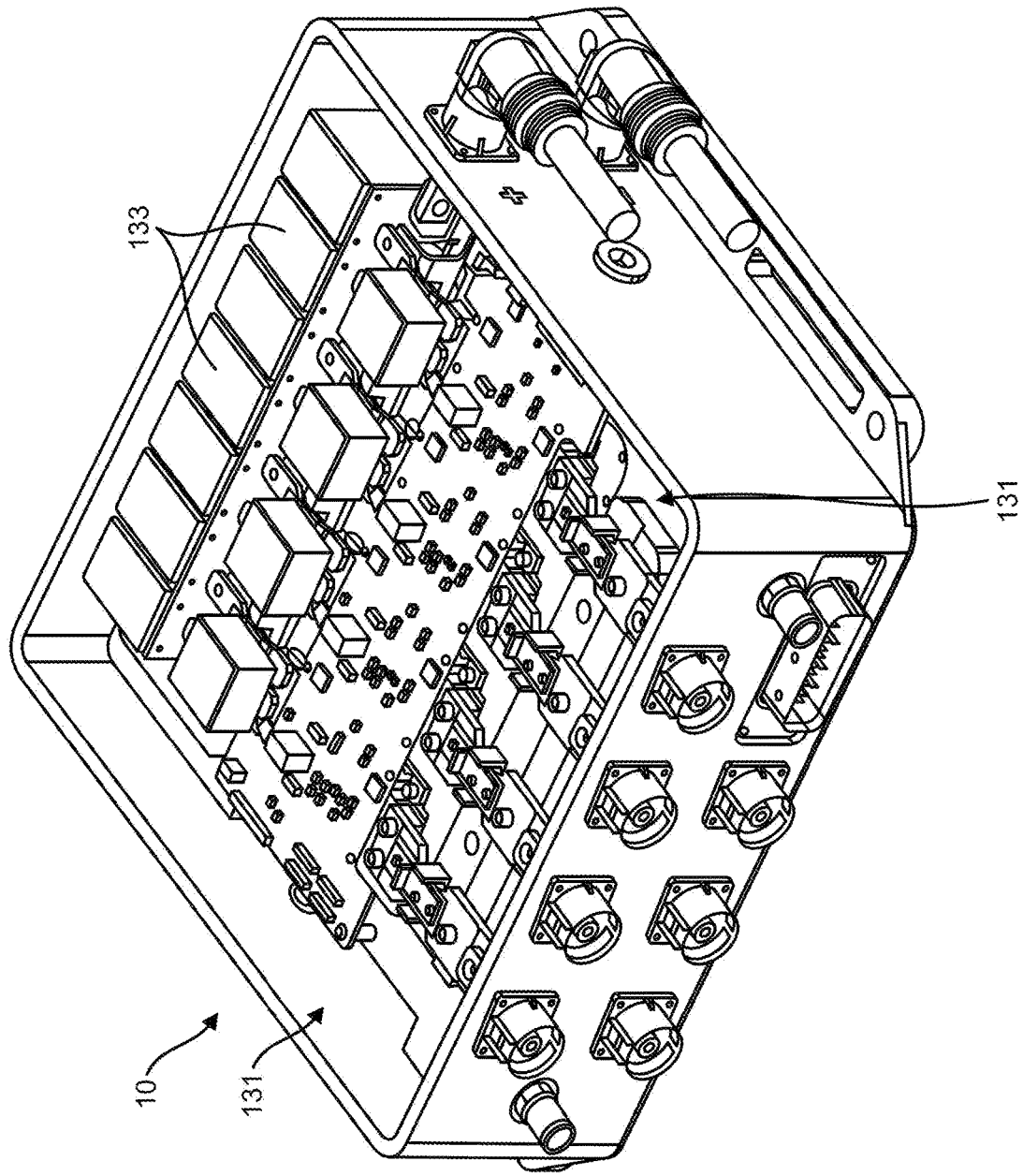
FIG. 7C is a partial cutaway view of an enclosure assembly employing box capacitors according to principles of the present disclosure.
Figure 7D:
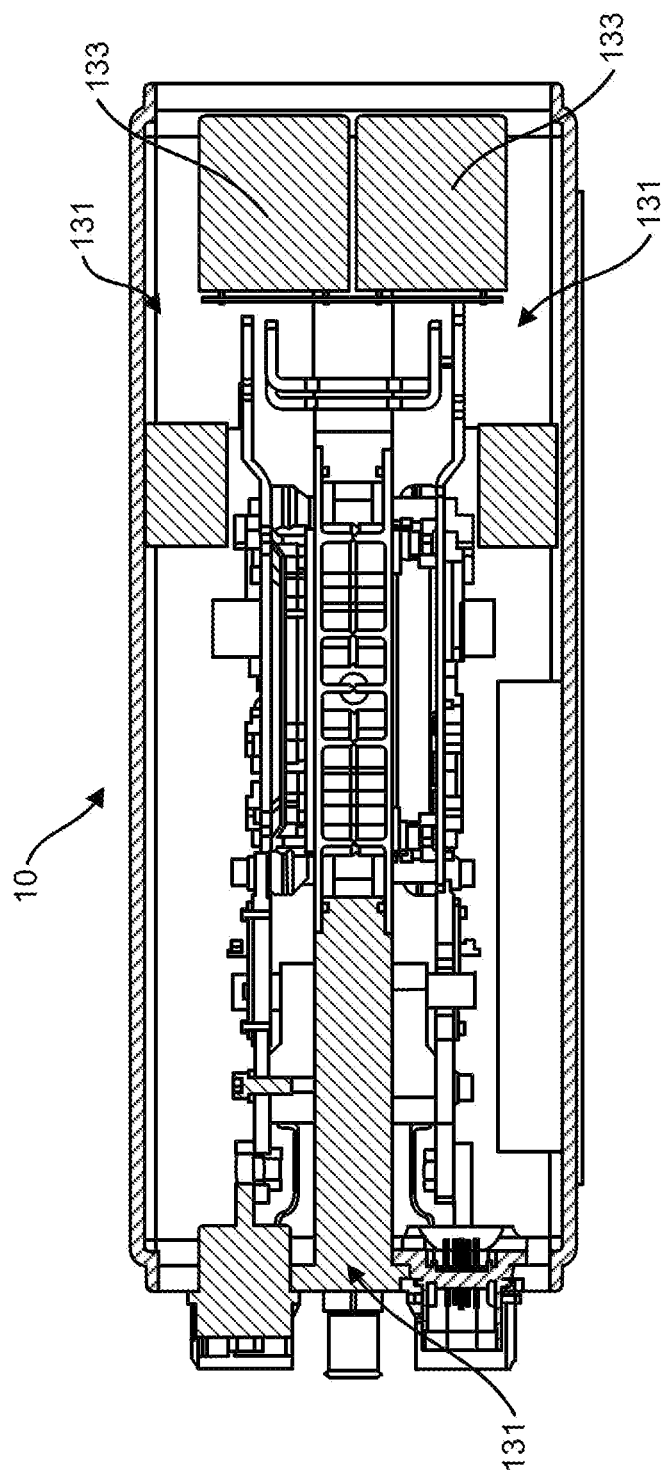
FIG. 7D is a cross-sectional view of the enclosure assembly shown in FIG. 7C taken at a midsection along a width of the enclosure assembly.

In addition, FIGS. 7A-7D show examples of the electrical device 10 with varied capacitors 133 according to principles of the present disclosure. FIG. 7A shows a partial cutaway view of an enclosure assembly 100 employing cylindrical capacitors 133. FIG. 7B shows a cross-sectional view of the enclosure assembly 100 shown in FIG. 7A taken at a midsection along a width of the enclosure assembly 100. FIG. 7C shows a partial cutaway view of an enclosure assembly 100 employing box capacitors 133 according to principles of the present disclosure. FIG. 7D shows a cross-sectional view of the enclosure assembly 100 shown in FIG. 7C taken at a midsection along a width of the enclosure assembly 100.

FIGS. 7A-7H show variations of capacitors 133 that are included in the internal electrical components 131 of the electrical device 10. The electrical device 10 shown here can be similar to those electrical devices discussed elsewhere herein. As previously discussed in relation to in FIGS.

1A-1D, the capacitor 133 can be a brick-type capacitor 133, but may be other types of capacitors 133 in different applications. For example, as shown in FIGS. 7A-7B, the capacitor 133 can be a cylindrical capacitor 133. As shown in FIGS. 7C-7D, the capacitor 133 can be a box capacitor 133. Depending on constraints (e.g., physical and electrical constraints), desires, and operational demand in a given application, for example, one or more of these capacitor 133 examples may be preferable.

Variations to the arrangement of capacitors within the electrical device 10 can be seen in FIGS. 8A-8D. The capacitors 133 in FIGS. 7A-7D are arranged to project inwardly (e.g., attached to a rear wall) into the electrical device 10 whereas the capacitors 133 shown in FIGS. 8A-8D are arranged to project upwardly (e.g., attached to a floor or other surface generally parallel with the floor). In examples, a height of the capacitors 133 can be greater than a width of the capacitors 133. In this regard, the additional footprint reduction can be achieved by arranging the capacitors 133 as shown in FIGS. 8A-8D.

Figure 8A:
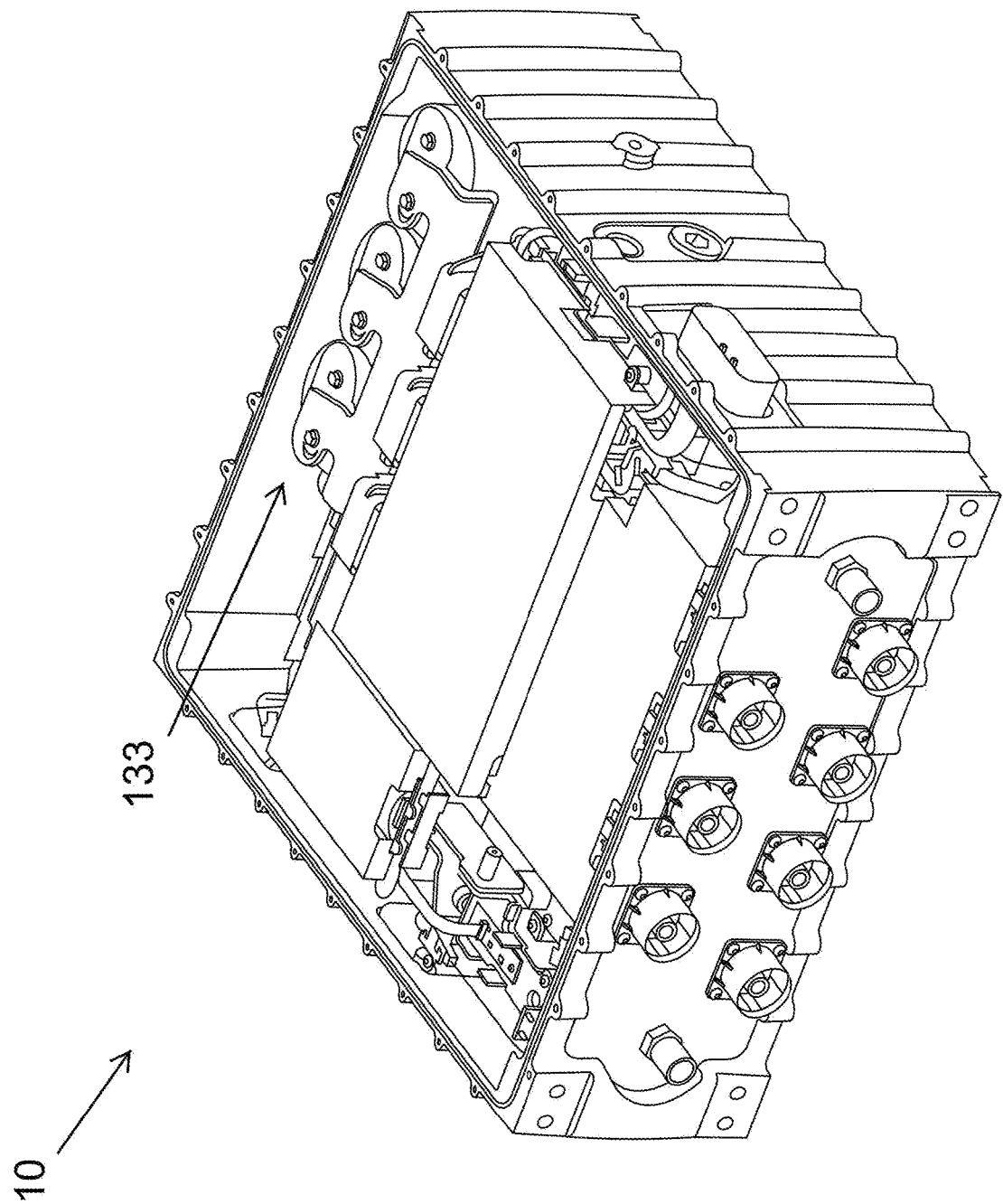
FIG. 8A is a perspective view of the electrical device with the top cover removed for illustration purposes only.
Figure 8B:
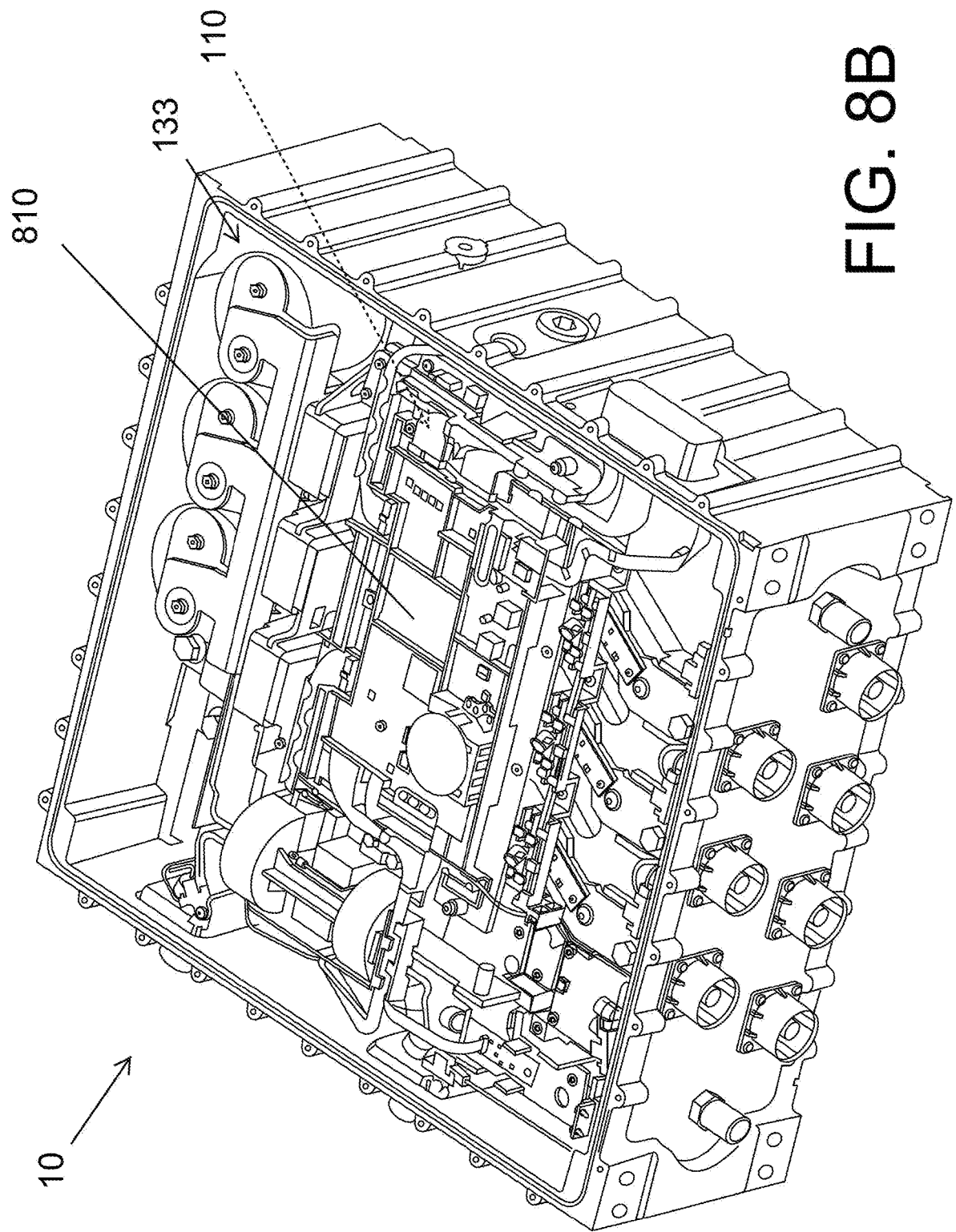
FIG. 8B is a perspective view of the electrical device in FIG. 8A with a flexible circuit cover removed for illustration purposes only to show a control board.
Figure 8C:
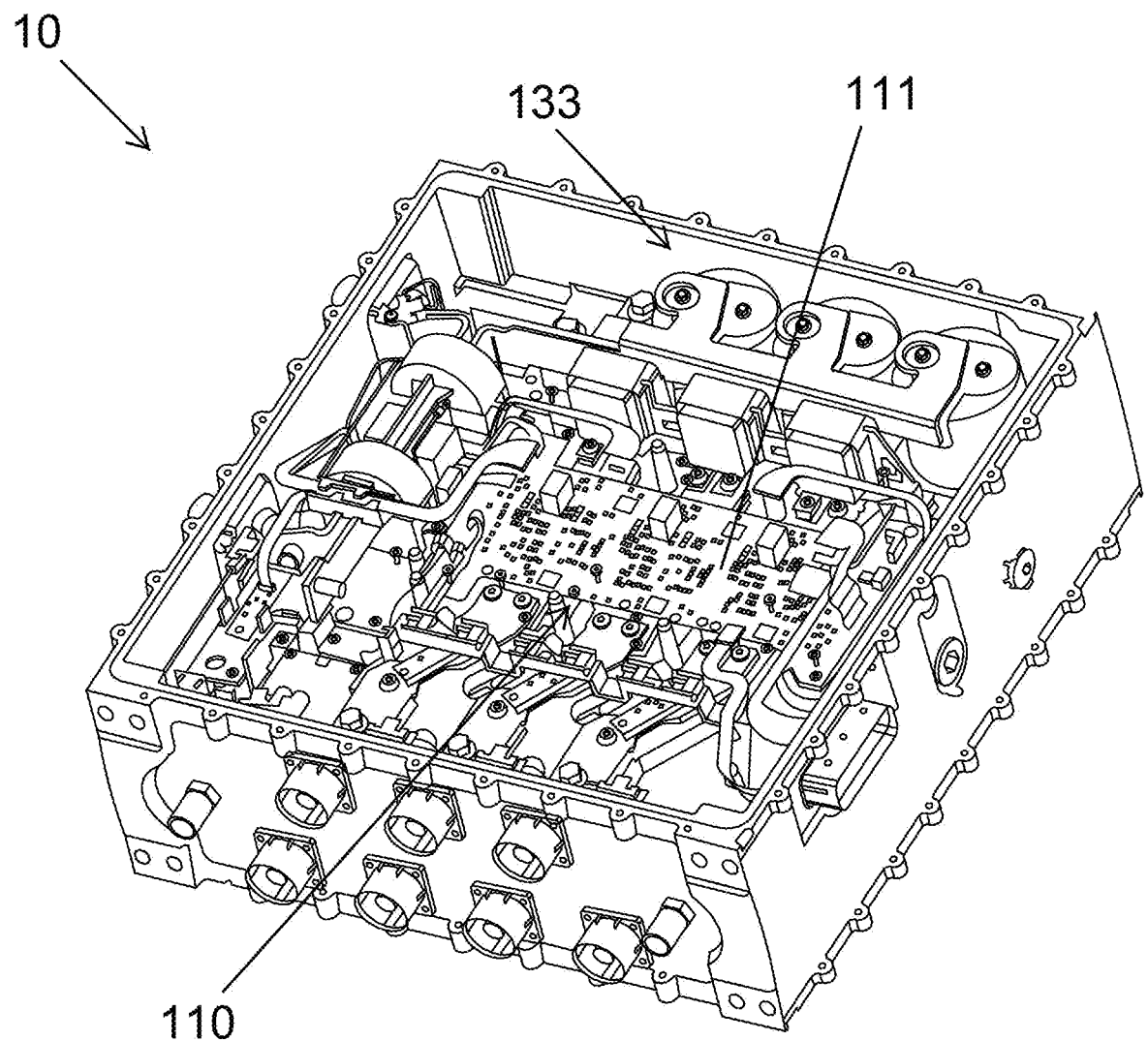
FIG. 8C is a perspective view of the electrical device in FIG. 8B with the control board removed for illustration purposes only to show the first circuit member of the flexible circuit assembly.
Figure 8D:
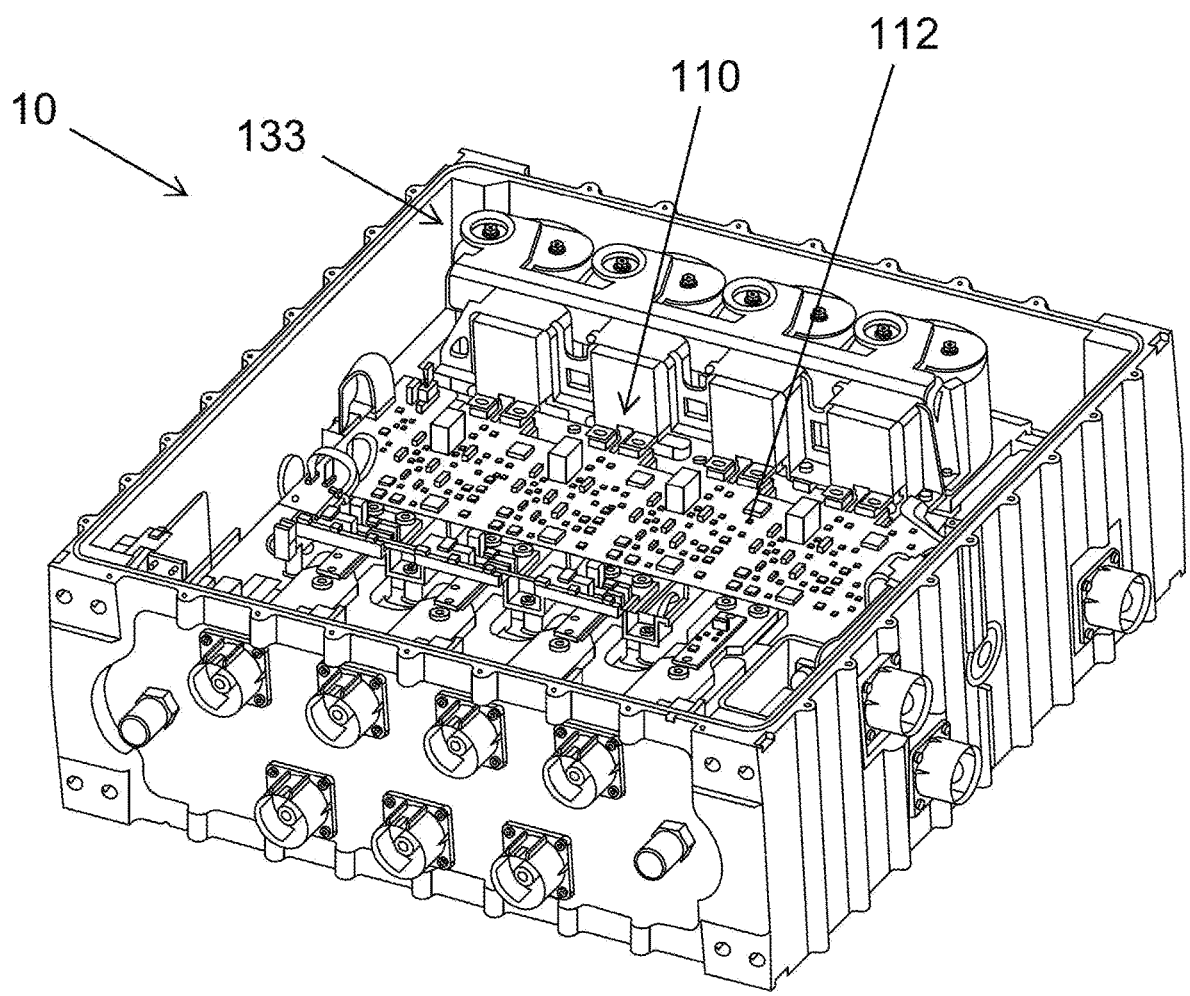
FIG. 8D is a perspective view of the electrical device in FIG. 8C from the bottom of the electrical device with the bottom cover removed for illustration purposes only to show the second circuit member in the flexible circuit board
Figure 8E:
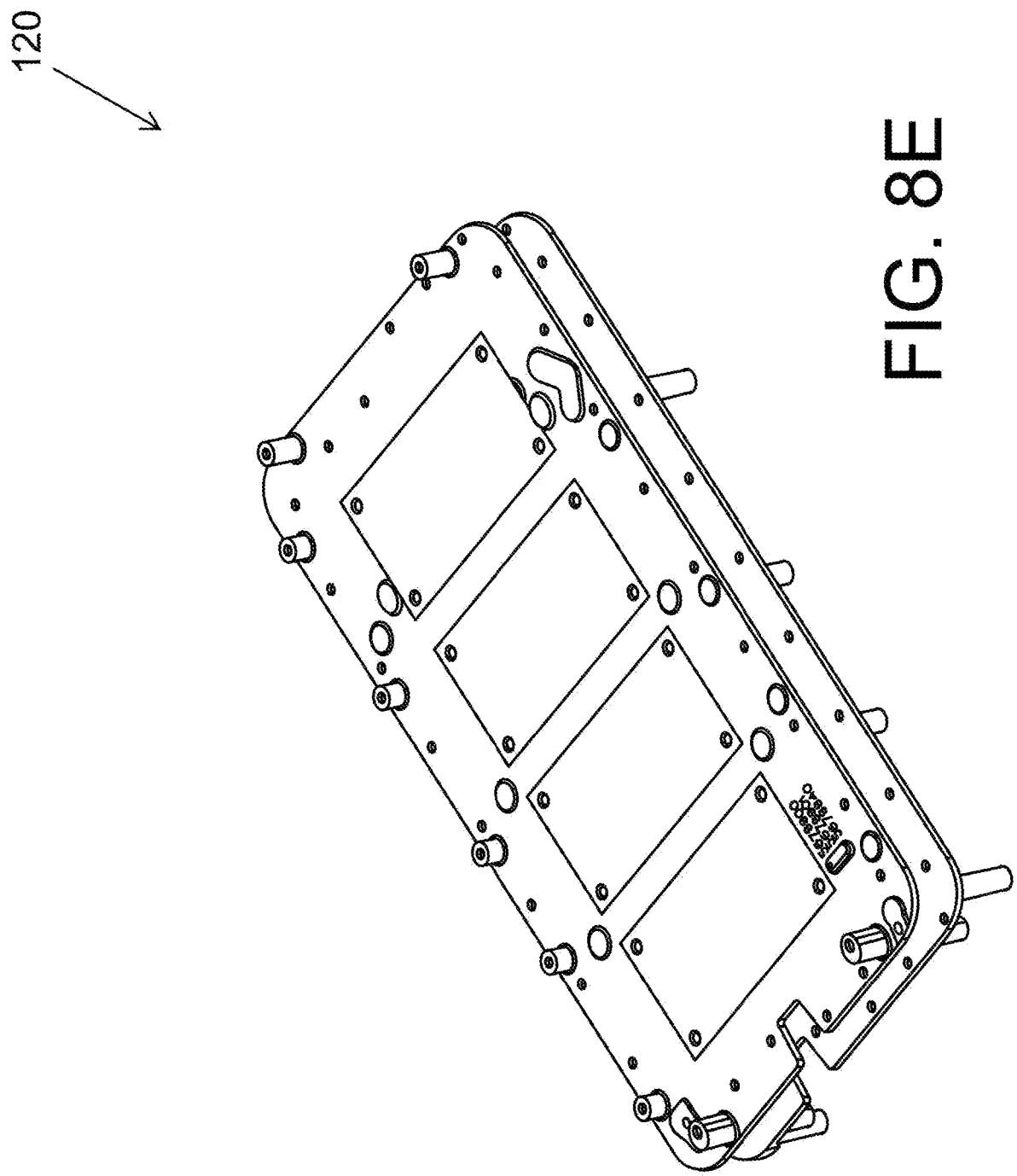
FIG. 8E is isolated perspective view of a bottom side of the cooling plate.
Figure 8F:
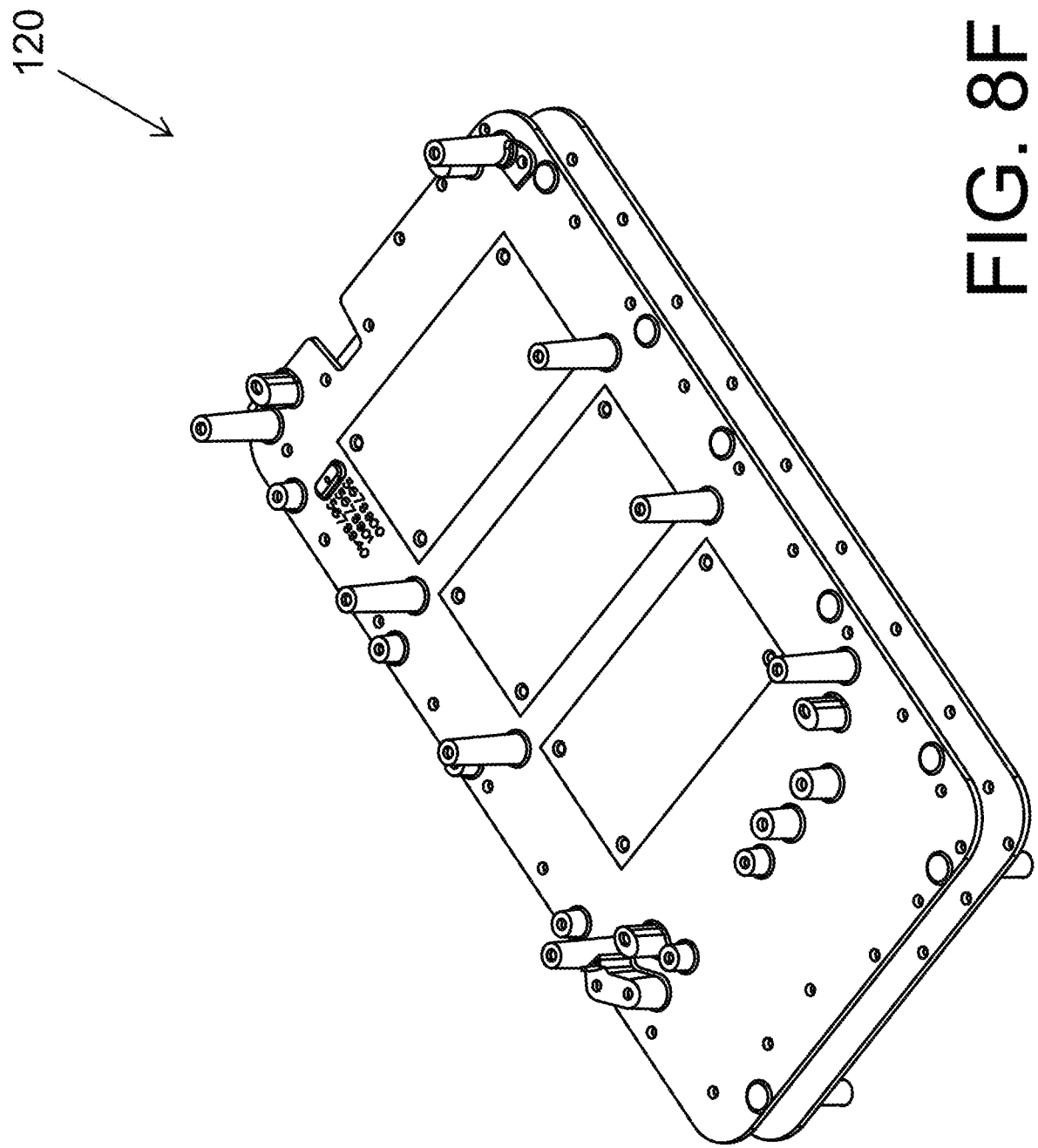
FIG. 8F is an isolated perspective view of a top side of the cooling plate.
Figure 8G:
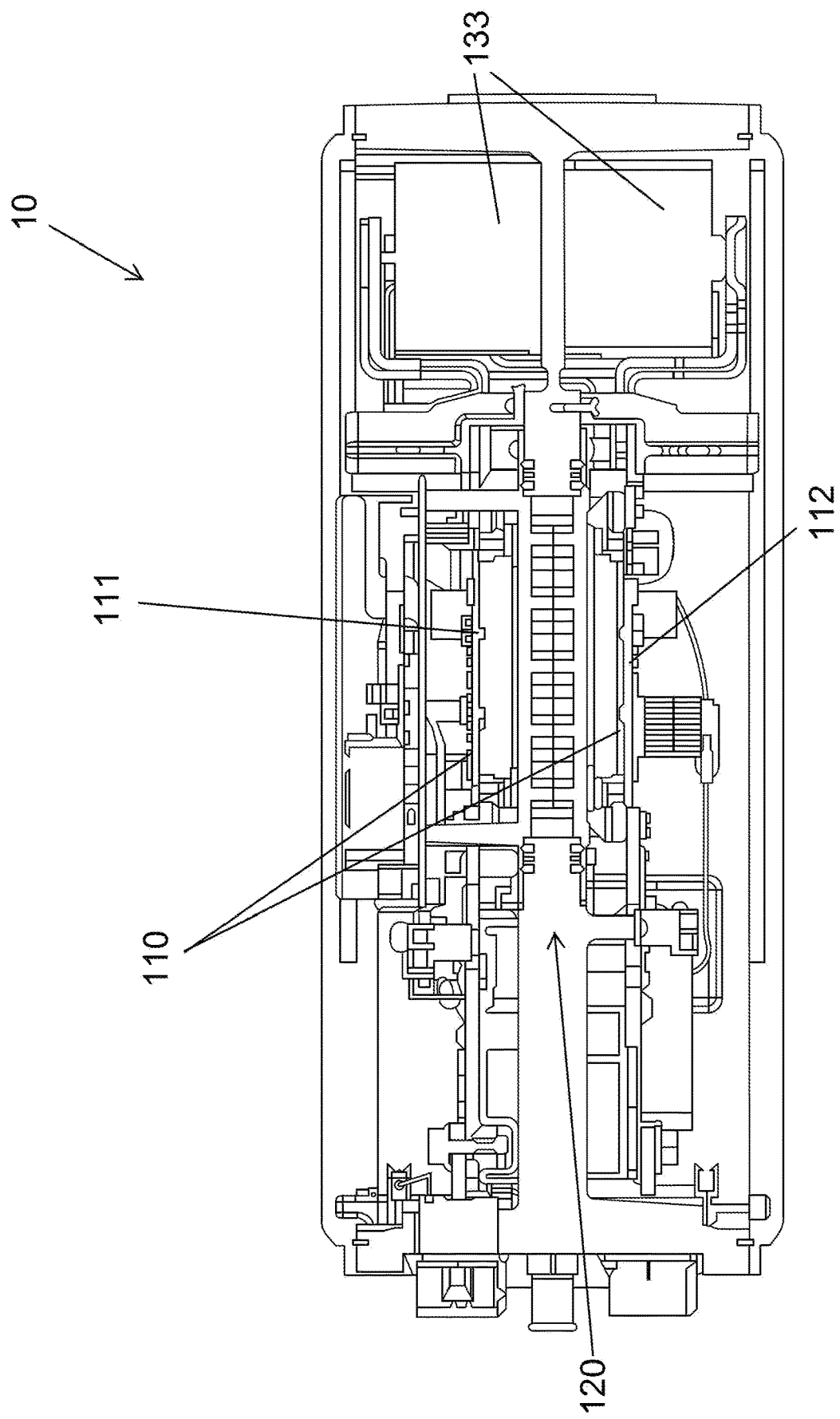
FIG. 8G is a cross-sectional view through a midsection of the width of the electrical device shown in FIG. 8A.

Other variations of the electrical device 10 can be seen between FIGS. 8A-8I. In particular, FIG. 8A is a perspective view of the electrical device 10 with the top cover removed for illustration purposes only. FIG. 8B is a perspective view of the electrical device 10 in FIG. 8A with a flexible circuit cover removed for illustration purposes only to show a control board 810. FIG. 8C is a perspective view of the electrical device 10 in FIG. 8B with the control board removed for illustration purposes only to show the first circuit member 111 of the flexible circuit assembly 110. FIG. 8D is a perspective view of the electrical device 10 in FIG. 8C from the bottom of the electrical device 10 with the bottom cover removed for illustration purposes only to show the second circuit member 112 in the flexible circuit board. FIG. 8E is isolated perspective view of a bottom side of the cooling plate. FIG. 8F is an isolated perspective view of a top side of the cooling plate. FIG. 8G is a cross-sectional view through a midsection of the width of the electrical device 10 shown in FIG. 8A. FIG. 8H is an isolated view of the cooling plate and body of the electrical device 10 in FIG. 8A. FIG. 8I is a close-up view showing a leak detection channel flanked by gaskets in FIG. 8H.

As can be seen in these figures, the first and second circuit members 111, 112 can be arranged in a stacked configuration similar to those disclosed elsewhere herein. These circuit members, however, can be in electrical communication by connecting to the control board 810. In this regard, the control board 810 can be common to the first and second circuit members 111, 112 and operate similarly to ribbon connectors described elsewhere herein. In addition, the control board 810 can facilitate governance of the first and second members, e.g., by relaying control signals from one or more processors (not shown) connected to the control board 810. This arrangement of the first and second circuit members 111, 112 is just one example of the many examples disclosed herein as one skilled in the art will appreciate.

As best seen in FIGS. 8E-8F, the cooling plate assembly 120 can include one or more bosses with which to facilitate mounting of connected components. For instance, the control board and first and second circuit members 111, 112 can connect to the cooling plate via the one or more bosses. Of course, the degree to which these one or more bosses protrude outwardly from the cooling plate assembly 120 can vary based on desired positioning of the connected components.

As best seen in FIGS. 8G-8I, the cooling plate assembly 120 can include a double seal 910 for cooling plate leak detection. In general, a leak detection channel 912 can be disposed between the seals 910 in the double seal 910. These components can abut portions of the body or other internal components of the electrical device 10 and be circumferentially arranged about the periphery of the cooling plate assembly 120, outside of the cooling passages 370. In this regard, a leak can be detected if the seal 910 (e.g., a gasket or other resilient seal) closest to the cooling passages 370 fails via the leak detection channel 912. Further, the seal furthest from the cooling passages 370 can maintain a seal to provide leak protection.

Figure 9:
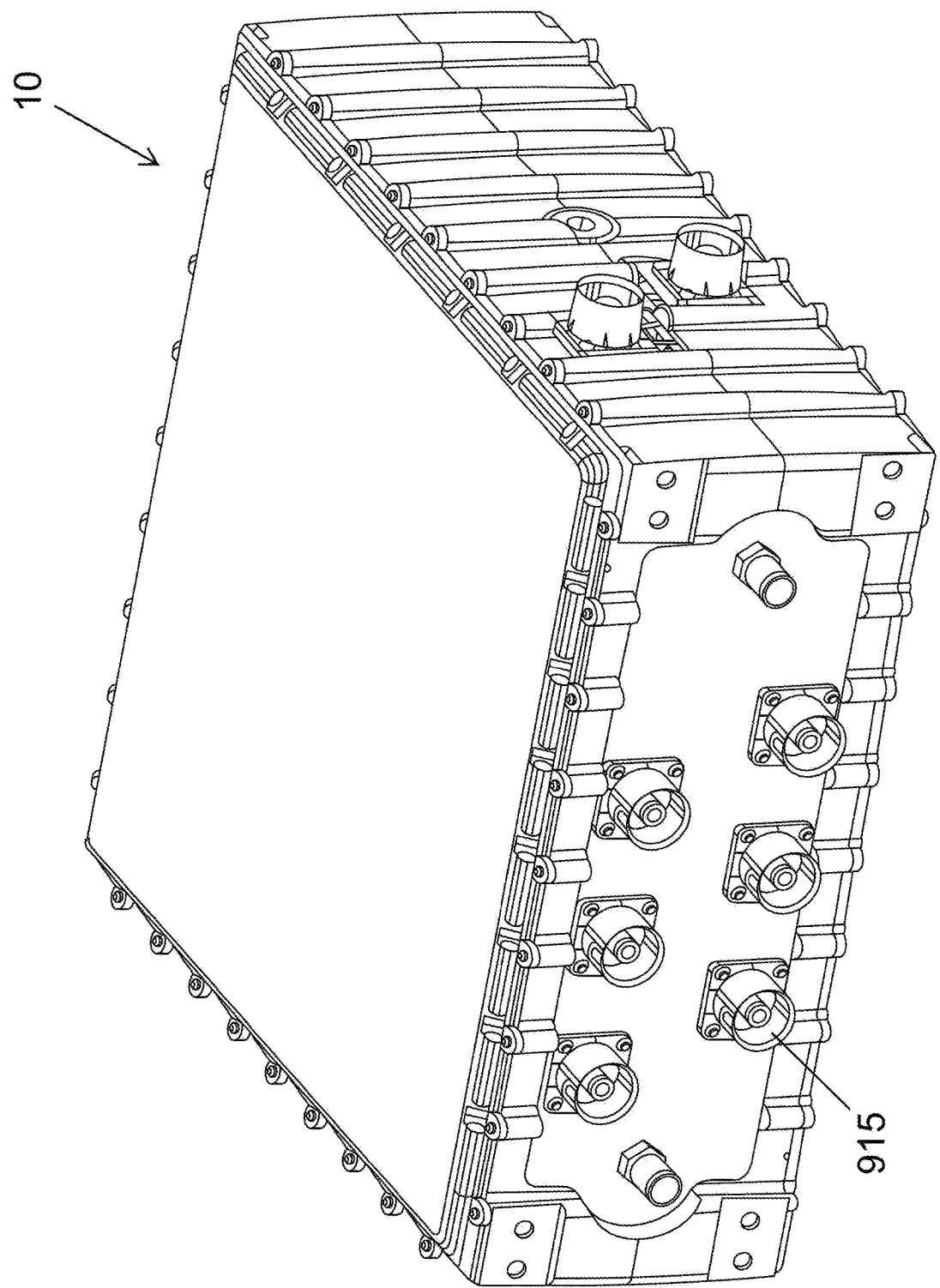
FIG. 9 is a perspective view a 6-phase electrical device.

FIG. 9 shows a 6-phase electrical device 10 rather than a 7-phase electrical device 10 as illustrated elsewhere herein. This electrical device 10 can otherwise be similar in all respects to those disclosed elsewhere herein. As one skilled in the art will appreciate, the number of phases 915 included in the electrical device 10 can vary from one to a plurality (e.g., 2, 5, 6, 7, 8 10, etc.) of phases without departing from the scope of this disclosure.

The connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements. The scope is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B or C may be present in a single embodiment; for example, A and B, A and C, B and C, or A and B and C.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art with the benefit of the present disclosure to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus While the present disclosure has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practices in the art to which this invention pertains.

What is claimed is:

1. An assembly, comprising:
a cooling plate assembly for dual-sided cooling, the cooling plate assembly comprising:
a first cooling plate that has a first cooling plate connector side and a first cooling plate cooling side that is opposite the first cooling plate connector side; and
a second cooling plate that has a second cooling plate connector side and a second cooling plate cooling side that is opposite the second cooling plate connector side, the second cooling plate configured to attach to the first cooling plate such that formed between the first cooling plate connector side and the second cooling plate connector side is at least one cooling passage through which a cooling fluid is flowed to transfer heat from both the first cooling plate cooling side and the second cooling plate cooling side to the cooling fluid; and
a flexible circuit assembly, comprising:
a first circuit member that has a first circuit member first side and a first circuit member second side that is opposite the first circuit member first side;
a second circuit member that has a second circuit member first side and a second circuit member second side; and
a connector member that is configured to electrically and mechanically connect the first circuit member to the second circuit member such that the first circuit member is in electrical communication with the second circuit member and so as to form a gap therebetween with which to receive the cooling plate assembly that is configured to promote cooling of both the first circuit member first side and the second circuit member first side,
wherein at least one of the first cooling plate connector side and the second cooling plate connector side includes a groove with which to receive a sealing gasket that is configured to promote sealing of the at least one cooling passage formed between the first cooling plate connector side and the second cooling plate connector side.

2. The flexible circuit assembly of claim 1, wherein at least one of the first circuit member and the second circuit member comprises a printed circuit board.

3. The flexible circuit assembly of claim 2, wherein the first circuit member is the printed circuit board, and the first circuit member first side includes an insulated-gate bipolar transistor.

4. The flexible circuit assembly of claim 1, when the cooling plate assembly is secured between the first circuit member and the second circuit member, the first circuit member and the second circuit member are substantially parallel to each other.

5. The flexible circuit assembly of claim 1, wherein the connector member is a ribbon connector.

6. The flexible circuit assembly of claim 1, wherein a periphery of the first circuit member includes a first circuit member first edge, wherein a periphery of the second circuit member includes a second circuit member first edge, and wherein the first circuit member first edge and the second circuit member first edge are coplanar when the cooling plate assembly is secured between the first circuit member and the second circuit member.

7. The cooling plate assembly of claim 1, wherein the at least one cooling passage comprises at least two separate cooling passages that have a shared inlet, and wherein a flow splitter is positioned at the shared inlet and configured to split a flow of the cooling fluid between the at least two separate cooling passages.

8. The cooling plate assembly of claim 7, wherein the at least two separate cooling passages are symmetric about a midplane extending through and perpendicular to a length of the cooling plate assembly.

9. The cooling plate assembly of claim 1, wherein each cooling passage in the at least one cooling passage includes a plurality of obstructions that is configured to influence a flow of the cooling fluid through the at least one cooling passage.

10. The cooling plate assembly of claim 9, wherein a first obstruction is included in an interior of the at least one cooling passage and a second obstruction is included at a wall of the at least one cooling passage.

11. The cooling plate assembly of claim 1, wherein the first cooling plate is identical to the second cooling plate.

12. The cooling plate assembly of claim 1, wherein the at least one cooling passage guides a flow of the cooling fluid from an inner portion of the cooling plate assembly to an outer portion of the cooling plate assembly.

13. The cooling plate assembly of claim 1, wherein the cooling plate assembly is configured to receive a flow of the cooling fluid at a cooling plate assembly inlet side and guide the flow of the cooling fluid between the cooling plate assembly inlet side and a cooling plate assembly outlet side via the at least one cooling passage before expelling the flow of the cooling fluid at the cooling plate assembly outlet side.

14. An enclosure assembly for an electrical device, the enclosure assembly comprising:
an enclosure body that is configured to house components of the electrical device in a component cavity included in the enclosure body; and the assembly of claim 1,
a cooling plate assembly for dual-sided cooling, the cooling plate assembly arranged at the component cavity and comprising:
a first cooling plate that has a first cooling plate connector side and a first cooling plate cooling side that is opposite the first cooling plate connector side; and
a second cooling plate that has a second cooling plate connector side and a second cooling plate cooling side that is opposite the second cooling plate connector side, the second cooling plate configured to attach to the first cooling plate such that formed between the first cooling plate connector side and the second cooling plate connector side is at least one cooling passage through which a cooling fluid is flowed to transfer heat from both the first cooling plate cooling side and the second cooling plate cooling side to the cooling fluid.

15. The enclosure assembly of claim 14, wherein a portion of the at least one cooling passage is formed between the enclosure body and the cooling plate assembly.

16. The enclosure assembly of claim 14, wherein both a supply inlet for supplying the cooling fluid to the cooling plate assembly and a supply outlet for expelling the cooling fluid from the cooling plate assembly are included in the enclosure body.

17. The enclosure assembly of claim 14, wherein the electrical device is a traction inverter.

\* \* \* \* \*